United States Patent
Tanaka et al.

[11] Patent Number: 6,087,006
[45] Date of Patent: Jul. 11, 2000

[54] SURFACE-PROTECTING FILM AND RESIN-SEALED SEMICONDUCTOR DEVICE HAVING SAID FILM

[75] Inventors: Jun Tanaka, Chigasaki; Fumio Kataoka; Haruhiko Kikkawa, both of Yokohama; Isao Obara, Kamakura; Keiko Isoda, Tokyo, all of Japan

[73] Assignee: Hitachi, Ltd., Tokyo, Japan

[21] Appl. No.: 08/517,613

[22] Filed: Aug. 22, 1995

[30] Foreign Application Priority Data

Aug. 31, 1994 [JP] Japan ..................... 6-207306

[51] Int. Cl.$^7$ .............. B32B 9/00; H01L 23/00; B29C 13/00
[52] U.S. Cl. .................. 428/411.1; 428/473.5; 428/901; 528/353; 264/272.17; 174/52.5; 257/643; 257/666; 257/676
[58] Field of Search ............ 528/353; 428/473.5, 428/411.1, 901; 264/272.17; 174/52.5; 257/643, 666, 676

[56] References Cited

U.S. PATENT DOCUMENTS

| | | | |
|---|---|---|---|
| 5,310,862 | 5/1994 | Nomura et al. | 528/350 |
| 5,314,842 | 5/1994 | Sawaya et al. | 437/211 |
| 5,348,835 | 9/1994 | Oha et al. | 528/353 |
| 5,397,682 | 3/1995 | Matsuoka et al. | 430/286.1 |
| 5,601,905 | 2/1997 | Watanabe et al. | 428/215 |
| 5,793,099 | 8/1998 | Murakami et al. | 257/666 |

FOREIGN PATENT DOCUMENTS 5-254064  10/1993  Japan .

*Primary Examiner*—P. Hampton-Hightower
*Attorney, Agent, or Firm*—Antonelli, Terry, Stout & Kraus, LLP

[57] ABSTRACT

A surface-protecting film is formed on the surface of the semiconductor element of a resin-sealed semiconductor device to prevent the peeling and cracking of the sealing member used in said device, by coating on said surface a polyimide precursor composition containing a polyimide precursor having a recurring unit constitution represented by the following general formula (1) and heat-curing the coated polyimide precursor composition:

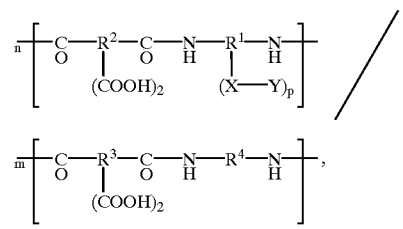

wherein $R^1$ is a trivalent or tetravalent aromatic group; $R^2$ and $R^3$ are each a tetravalent organic group having 4 or more carbon atoms; $R^4$ is a bivalent organic group having 4 or more carbon atoms; X is a bivalent organic group containing at least one member selected from the group consisting of oxygen and nitrogen: Y is a monovalent organic group having 15 or less carbon atoms; n=5–100 and m=0–95 with a proviso that n+m=100; and p is 1 or 2).

12 Claims, 2 Drawing Sheets

SURFACE-PROTECTING FILM AND RESIN-SEALED SEMICONDUCTOR DEVICE HAVING SAID FILM

BACKGROUND OF THE INVENTION

1. Field of the Invention

The present invention relates to a semiconductor device, a process for production thereof, and a surface-protecting film. More particularly, the present invention relates to a resin-sealed semiconductor device obtained by resin-sealing a semiconductor element whose surface is coated with a polyimide, a process for production thereof, and a surface-protecting film suitable for protection of a semiconductor element.

2. Description of the Related Art

In the conventional production of a resin-sealed semiconductor device, it is conducted, for the surface protection of semiconductor element or for the prevention of semiconductor element malfunctioning caused by the α-ray emitted from sealing resin, to form a surface-protecting film of a polyimide resin on the surface of a semiconductor element and then conduct sealing with a molding resin.

Mounting of such a resin-sealed semiconductor device is now conducted mainly by surface mounting. In the surface mounting, the leads of semiconductor device and the wires of printed wiring board are temporarily connected, and the semiconductor device and the wiring board are heated to conduct soldering. The heating is conducted mainly by a method of using a radiant heat of infrared rays (infrared reflowing) or a method of using a condensation heat of fluorine-based inert fluid (vapor phase reflowing).

In such surface mounting, it occurs in some cases that the water absorbed inside a resin-sealed semiconductor device is rapidly vaporized by the heat applied during soldering and the resulting vapor pressure allows the sealing member (resin) of said device to generate cracking. This cracking poses a serious problem with respect to the reliability of semiconductor device [Transactions of the Japan Society of Mechanical Engineers (A), 55 (510), 356–363 (1989)].

SUMMARY OF THE INVENTION

The first object of the present invention is to provide a semiconductor device capable of preventing the cracking and peeling of the sealing member during soldering. The second object of the present invention is to provide a process for producing such a semiconductor device. The third object of the present invention is to provide a surface-protecting film suitably used in such a semiconductor device.

According to the present invention, the peeling and cracking of sealing member occurring during soldering can be prevented by the use of a polyimide film formed from a polyimide precursor having polar substituents as the side chains.

PREFERRED EMBODIMENTS OF THE INVENTION

Figure 1:
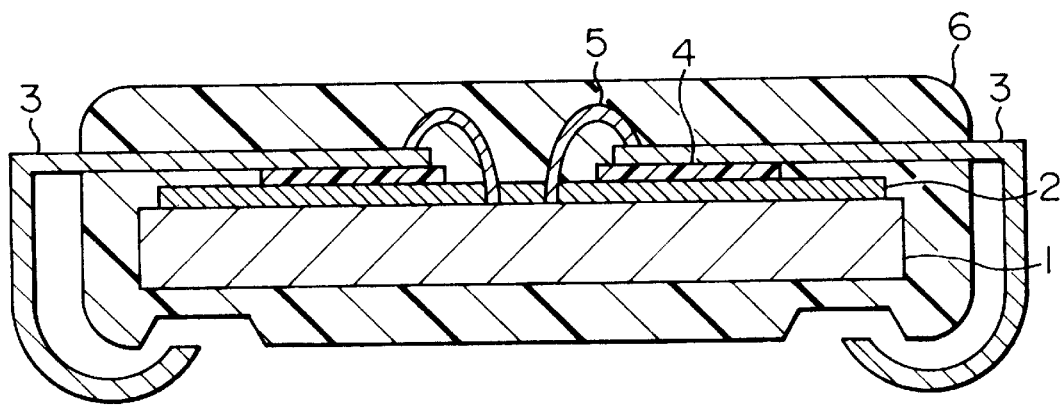
FIG. 1 is a sectional view showing a resin-sealed dynamic random access memory which is an example of the semiconductor device of the present invention.

In the present specification, when the recurring units of a polymer are represented by -A-, -B- and -C-, an expression of n -(A)-/m -(B)- refers to that the ratio of the recurring units -A- and -B- in the polymer molecule is n:m; and an expression of n -(A)-/m -(B)-/l -(C)- refers to that the ratio of the recurring units -A-, -B- and -C- in the polymer molecule is n:m:l. The polymer may be a random copolymer or a block copolymer.

In order to achieve the above first object, there is provided, in the present invention, a resin-sealed semiconductor device comprising a semiconductor element having a surface-protecting film, external terminals for electrical conduction with outside, and a sealing member comprising a resin, in which semiconductor device the surface-protecting film comprises a polyimide obtained by heat-curing a polyimide precursor composition containing a polyimide precursor having a recurring unit constitution represented by the following general formula (1)

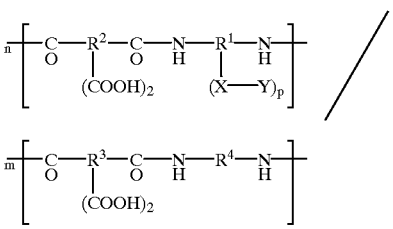

(1)

(wherein $R^1$ is a trivalent or tetravalent aromatic group; $R^2$ and $R^3$ are each a tetravalent organic group having 4 or more carbon atoms; $R^4$ is a bivalent organic group having 4 or more carbon atoms; X is a bivalent organic group containing at least one member selected from the group consisting of oxygen and nitrogen; Y is a monovalent organic group having 15 or less carbon atoms; n=5–100 and m=0–95 with a proviso that n+m=100; and p is 1 or 2). Incidentally, the semiconductor element may be either of a semiconductor integrated circuit element and a discrete transistor element.

The polyimide film obtained by heat-curing a polyimide precursor having a recurring unit constitution represented by the general formula (1) has very good adhesion to the sealing member (molding resin) of the semiconductor device. Therefore, even when the water vapor pressure inside the polyimide film gets high during reflowing, the polyimide film does not peel from the sealing member. Hence, in the present semiconductor device in which the semiconductor element has a surface-protecting film consisting of said polyimide film, there can be prevented cracking of the sealing member (molding resin) and peeling at the interface between the sealing member and the surface-protecting polyimide film.

Description is made on the semiconductor device of the present invention, with reference to an example of said device, i.e. a resin-sealed semiconductor device of lead-on-chip type (hereinafter abbreviated to LOC type) shown in FIG. 1. Incidentally, the semiconductor device of the present invention is not restricted to a LOC type alone and may be a resin-sealed semiconductor device of other type such as chip-on-lead type (hereinafter referred to as COL type) or the like.

The resin-sealed semiconductor device of the present invention comprises a semiconductor element 1 having a surface-protecting polyimide film 2 on at least part of the surface; external terminals 3; an adhesive member 4 bonding the semiconductor element 1 and the external terminals 3 via the surface-protecting polyimide film 2; wires 5 electrically connecting the semiconductor element 1 and the external terminals 3; and a sealing member 6 completely sealing the semiconductor element 1 and the wires 5. In the semiconductor device shown in FIG. 1, the external terminals 3 function also as lead frames.

Figure 3:
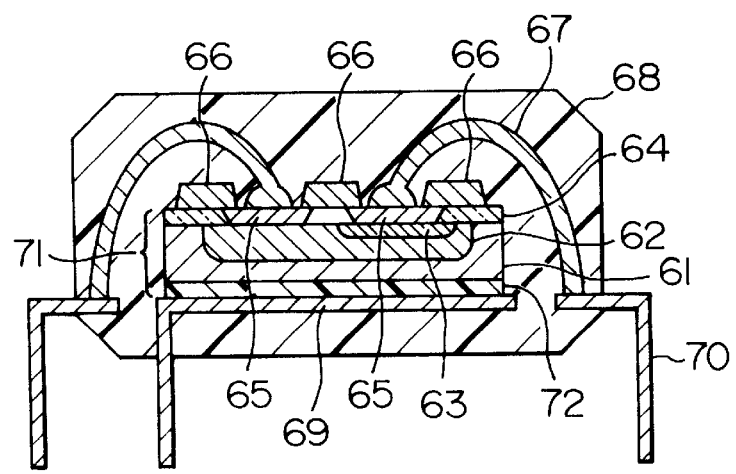
FIG. 3 is a sectional view showing a resin-sealed discrete transistor device which is an example of the semiconductor device of the present invention.

A discrete transistor device is shown in FIG. 3 as an example of the resin-sealed semiconductor device of COL type. This discrete transistor device comprises a discrete transistor element 71 having a surface-protecting polyimide film 66; external terminals 70; lead frames 65; an adhesive member 72; gold wires 67 electrically connecting the discrete transistor element 71 and the external terminals 70; and a sealing member completely sealing the element 71 and the wires 67. The surface-protecting polyimide film 66 is a polyimide film obtained by heat-curing a polyimide precursor composition containing a polyimide precursor having a recurring unit constitution represented by the above general formula (1). The transistor element 71 consists of a silicon chip 61 functioning also as a collector; a base 62 and an emitter 63 both formed in the chip 61; and a $SiO_2$ layer 64 formed on the side of the chip 61 in which the base 62 and the emitter 63 are formed. The $SiO_2$ layer 64 has through-holes for formation of bonding pad areas, at the places corresponding to the electrodes of the base 62 and the emitter 63; and each through-hole is filled with aluminum to form a conductor layer 65 of bonding pad area. The surface-protecting film has through-holes at the places corresponding to the bonding pad areas, and the wires 67 connect the conductor layers 65 of bonding pad areas and the external terminals 70.

In order to effectively prevent cracking of the sealing member 6 or 68, or peeling between the sealing member 6 or 68 and the surface-protecting film 2 or 66, it is necessary that at the interface between the surface-protecting film 2 or 66 and the sealing member 6 or 68, the polyimide (constituting the surface-protecting film 2 or 66) and the molding resin (constituting the sealing member 6 or 68) are chemically bonded with each other or have a strong intermolecular action. Hence, in the present invention, there was used, as the polyimide constituting the surface-protecting film 2 or 66, a polyimide obtained by heat-curing a composition containing a polyimide precursor having, as the side chains, polar substituents which can react with or have an interaction with the molding resin (e.g. an epoxy resin). By using such a polyimide, the surface-protecting film 2 or 66 has very good adhesion to the sealing member 6 or 68 and, even when water vapor generates inside the semiconductor element during solder reflowing, there can be suppressed peeling between the surface-protecting film 2 or 66 and the sealing member 6 or 68, or cracking of the sealing member 6 or 68.

It is presumed that during the heat-curing of the polyimide precursor having a recurring unit constitution represented by the general formula (1), the side chain linkage X-Y of the polyimide precursor undergoes scission and, during the curing of the molding resin (e.g. an epoxy resin), the residual group of the X-Y linkage is chemically bonded with the molding resin or comes to have a strong interaction with the polar group of the molding resin.

The polyimide precursor composition may comprise a polyimide precursor alone, or a polyimide precursor and an appropriate solvent. Preferably, however, the composition comprises a polyimide precursor, an amine compound having a carbon-to-carbon double bond and a photosensitizer, because such a composition has photosensitivity and can produce a surface-protecting film more easily. The amounts of the components in the composition are desirably such that when the amount of the polyimide precursor is 100 parts by weight, the amount of the amine compound having a carbon-to-carbon double bond is 1–400 parts by weight and the amount of the photosensitizer is 0.1–30 parts by weight. Such amount proportions can allow the composition to have photosensitivity without impairing the adhesion between the resulting polyimide film and the sealing member. Even with such a polyimide precursor composition containing a polyimide precursor, a photosensitive amine compound and a photosensitizer, the side chain linkage X-Y of the polyimide precursor undergoes scission during the heat-curing of the precursor and the residual group is bonded with the molding resin, whereby strong adhesion between the surface-protecting film 2 or 66 and the sealing member 6 or 68 is secured.

In order to achieve the above second object, there is provided, in the present invention, a process for producing a resin-sealed semiconductor device, which comprises the following steps (i), (ii) and (iii) in this order:

(i) a protecting film formation step of forming, on at least part of the surface of a semiconductor element, a surface-protecting polyimide film by coating thereon a polyimide precursor composition containing a polyimide precursor having a recurring unit constitution represented by the above general formula (1) and heat-curing the coated polyimide precursor composition, (ii) a semiconductor element-mounting step of mounting the above-obtained semiconductor element having a protecting film, on external terminals, and (iii) a sealing step of sealing the semiconductor element mounted on external terminals, with a molding resin.

The polyimide precursor composition used in the step (i) preferably contains said polyimide precursor, an amine compound having a carbon-to-carbon double bond and a photosensitizer, because such a composition has photosensitivity. The amounts of the components in the composition are desirably such that when the amount of the polyimide precursor is 100 parts by weight, the amount of the amine compound having a carbon-to-carbon double bond is 1–400 parts by weight and the amount of the photosensitizer is 0.1–30 parts by weight. Such amount proportions can allow the composition to have photosensitivity without impairing the adhesion between the resulting polyimide film and the sealing member.

The surface-protecting film of semiconductor element must be formed on the area of the front or back side of a semiconductor chip (a silicon wafer) other than the bonding pad areas allowing for electrical conduction with external terminals and the to-be-scribed regions at which the wafer is to be cut to separate each semiconductor element. Use of a polyimide precursor composition having photosensitivity permits formation of a surface-protecting film in a pattern form by photoetching and therefore is very suitable for formation of a surface-protecting film of semiconductor element.

Next, detailed description is made on the process for production of semiconductor device, of the present invention, with reference to FIGS. 2A to 2F. While FIGS. 2A to 2F show a process for production of a semiconductor device of LOC type shown in FIG. 1, the present process is not restricted only to said process for production of semiconductor device of LOC type and can be applied also to a process for production of other semiconductor device such as COL type or the like as long as the device is obtained by bonding a semiconductor element and external terminals (lead frames) and then conducting sealing with a molding resin.

(i) Surface-protecting Film Formation Step

Figure 2A:
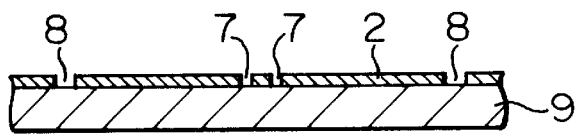
FIGS. 2A to 2F are drawings showing an example of the process for production of semiconductor device, of the present invention.

As shown in FIG. 2A, a surface-protecting film 2 consisting of a polyimide is formed on one side of a silicon wafer 9 in which element regions and wire layers have been formed. The surface-protecting film 2 has a predetermined pattern, and the element 1 (see FIG. 2B) is exposed at the bonding pad areas 7 and the to-be-scribed regions 8. The protecting film of pattern shape is formed by various methods, for example, (1) a method of coating a polyimide precursor composition on the area of one side of the silicon wafer other than said areas 7 and said regions 8 and (2) a method of coating said composition on one side of said silicon wafer, heat-curing the coated composition to form a polyimide film and removing, from the film, the portions corresponding to said areas 7 and said regions 8 by etching or the like.

Figure 2B:
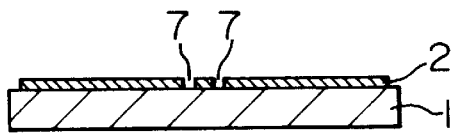

The thus-obtained silicon wafer 9 having a surface-protecting film 2 is cut at the to-be-scribed regions to obtain each semiconductor element 1 having a surface-protecting film 2, shown in FIG. 2B. In the above has been described a method for obtaining a semiconductor element 1 having a surface-protecting film 2, by forming a surface-protecting film 2 on a silicon wafer 9 and cutting the wafer 9. Alternatively, the semiconductor element 1 having a surface-protecting film 2 may be obtained by cutting a silicon wafer 9 to obtain a semiconductor element 1, coating a polyimide precursor composition on the semiconductor element 1, and heat-curing the coated composition.

(ii) Semiconductor Element-mounting Step

A polyamide imide ether layer is formed on one side of a polyimide film to form an adhesive member 4. On the adhesive member 4 are provided external terminals 3, and beneath the adhesive member 4 is provided the semiconductor element 1 having a surface-protecting film 2, obtained in the step (i). They are press-bonded at 400° C. to obtain a material shown in FIG. 2C, in which a semiconductor element 1 and external terminals 3 are connected via a surface-protecting film 2 and an adhesive member 4. As shown in FIG. 2D, the bonding pad areas 7 of the semiconductor element 1 and the external terminals 3 are connected with gold wires 5 by the use of a wire bonder to secure electrical connection between the semiconductor element 1 and the external terminals 3.

(iii) Sealing Step

Figure 2C:
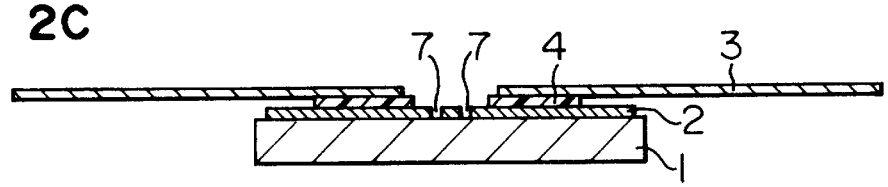
Figure 2D:
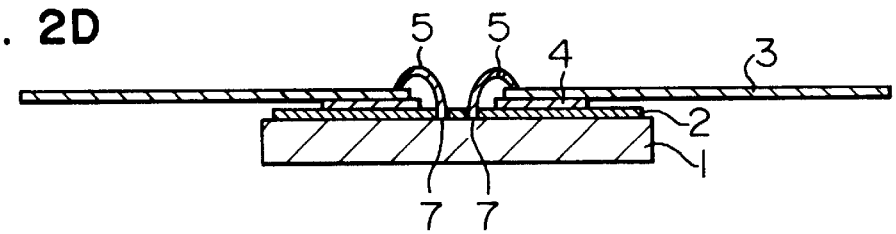
Figure 2E:
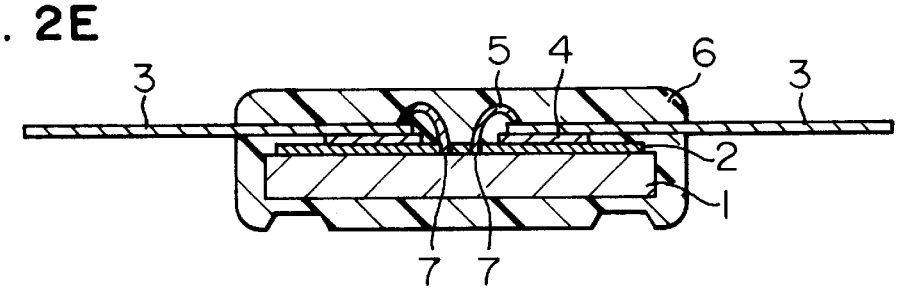
Figure 2F:
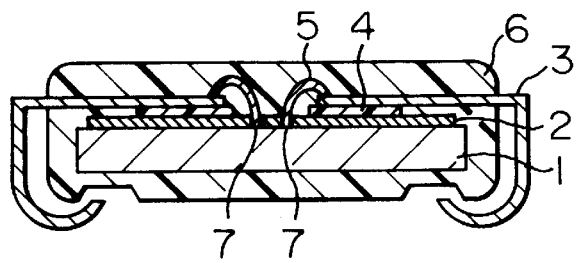

As shown in FIG. 2E, the material obtained in the step (ii) is molded with a silica-containing epoxy resin at a molding temperature of 180° C. at a molding pressure of 70 kg/cm² to form a sealing member 6. Lastly, the external terminals 3 are bent in a predetermined shape to obtain a resin-sealed semiconductor device shown in FIG. 2F.

In the step (i) for formation of surface-protecting film, formation of surface-protecting film of pattern shape on the area of semiconductor element other than the bonding pad areas 7 and the to-be-scribed regions 8 can be conducted by the use of a photoetching method such as (1) a wet etching method using a photoresist and an etchant for polyimide and (2) a dry etching method of using an inorganic or metallic film of pattern shape as a mask and removing the exposed polyimide film portion by the use of an oxygen plasma.

When the polyimide precursor composition is endowed with photosensitivity, the polyimide precursor composition is coated on the semiconductor chip 9 and dried to form a dry film; the film is irradiated with ultraviolet rays or other radiation through a photomask; then, development is conducted to obtain a pattern of polyimide precursor; the pattern is heat-cured; thereby, a polyimide pattern can be obtained.

In order to achieve the above third object, there is provided, in the present invention, a surface-protecting film protecting the surface of a semiconductor element, which is a polyimide film obtained by heat-curing a polyimide precursor composition containing a polyimide precursor having a recurring unit constitution represented by the above general formula (1). The surface-protecting film of the present invention can also be used as an α-ray-shielding film.

The polyimide film obtained by heat-curing a polyimide precursor having a recurring unit constitution represented by the general formula (1) has very good adhesion to sealing materials and moreover has excellent heat resistance and mechanical properties and therefore is suitable for the surface protection of a semiconductor, particularly a semiconductor used in resin-sealed semiconductor device.

Next, detailed description is made on the polyimide precursor having a recurring unit constitution represented by the general formula (1).

In the general formula (1) which is the recurring unit constitution of the polyimide precursor used in the present invention, $R^1$ is a trivalent or tetravalent aromatic group and may be two or more different groups, in view of the mechanical properties and heat resistance of the polyimide film obtained. Specific examples of $R^1$ include groups having the chemical formulas (2) shown below, in view of the mechanical properties and heat resistance of the polyimide film obtained. $R^1$, however, is not restricted to these examples.

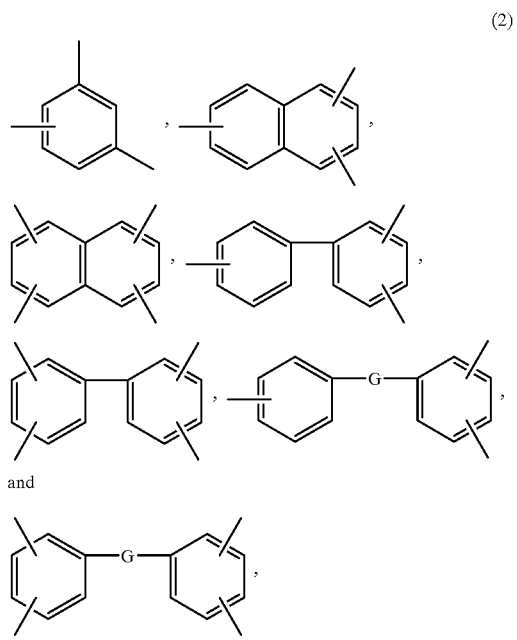

(2)

and

In the above, G is a group selected from the group consisting of the following chemical formulas (3).

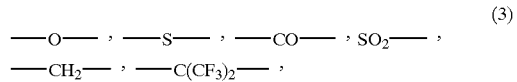

(3)

-continued

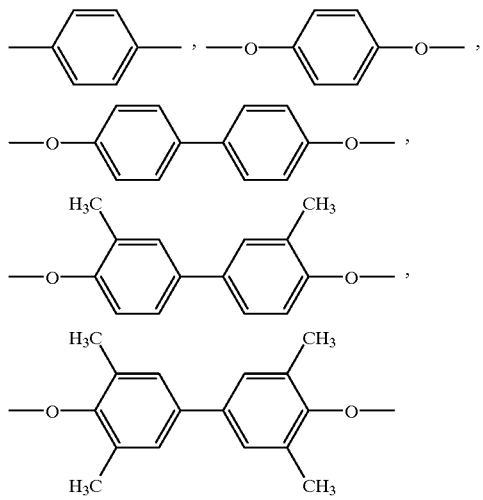

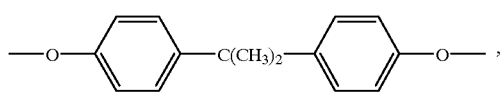

In the general formula (1), $R^2$ and $R^3$ are each independently a tetravalent organic group having 4 or more carbon atoms, in view of the mechanical properties and heat resistance of the polyimide film obtained. $R^2$ and $R^3$ may be the same or different, and both or either of $R^2$ and $R^3$ may be two or more different groups. Specific examples of $R^2$ and $R^3$ include groups having the chemical formulas (4) shown below, in view of the mechanical properties and heat resistance of the polyimide film obtained. $R^2$ and $R^3$, however, are not restricted to these examples.

(4)

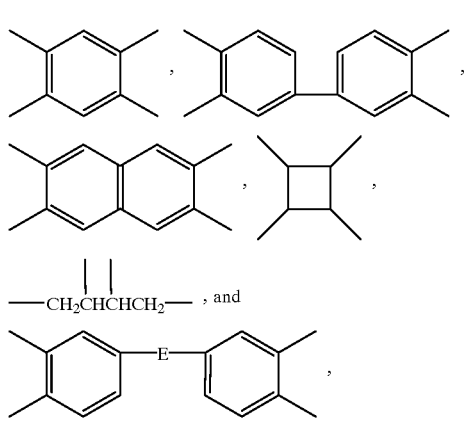

In the above, E is a group selected from the group consisting of the following chemical formulas.

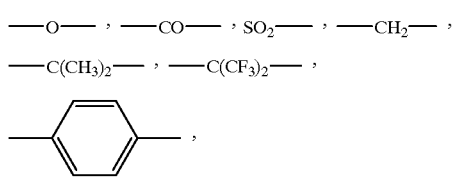

-continued

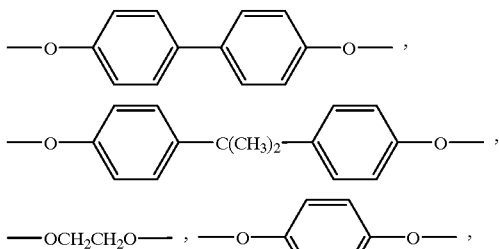

and

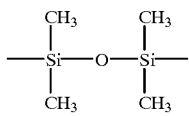

In the general formula (1), $R^4$ is a bivalent organic group having 4 or more carbon atoms and may be two or more different groups, in view of the mechanical properties and heat resistance of the polyimide film obtained. Specific examples of $R^4$ include groups having the following chemical formulas (5), in view of the mechanical properties and heat resistance of the polyimide film obtained. $R^4$, however, is not restricted to these examples.

(5)

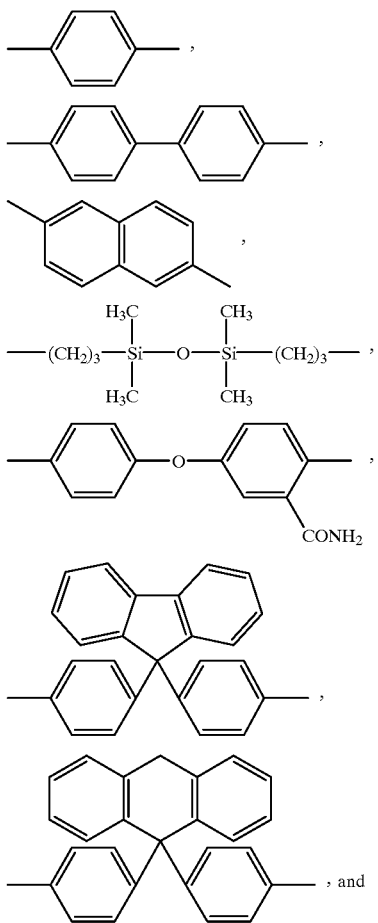

-continued

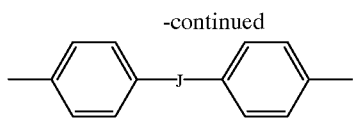

In the above, J is a group selected from the group consisting of the following chemical formulas.

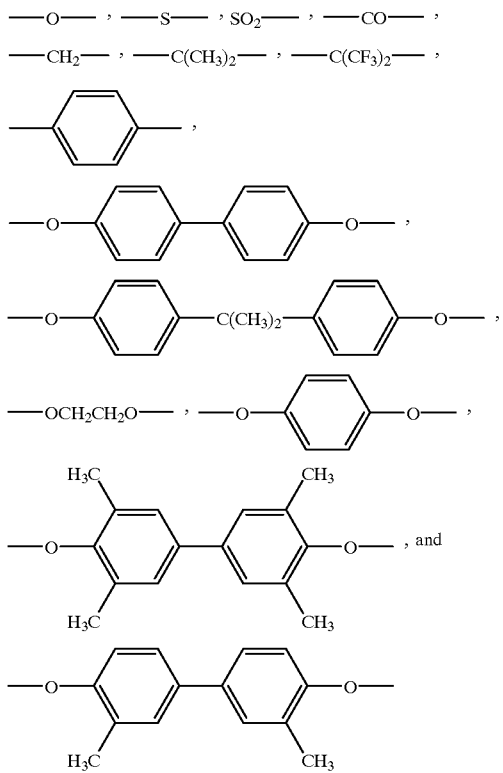

In the general formula (1), X is a bivalent group having at least one member selected from the group consisting of oxygen and nitrogen. Specific examples of X, which are suitable in the present invention, include —COO—, —CONH—, —CO—, —NHCOO—, —NHCO—, —NHCONH—, —NH—, —$NR^5$—, —O— and —$CH_2O$—. Of these groups, preferred are —COO—, —CO—, —NHCOO—, —NHCO—, —NHCONH—, —NH—, —$NR^5$— and —$CH_2O$— and particularly preferred are —COO—, —NHCOO— and —NHCONH—, in view of the reactivity with molding resin (e.g. epoxy resin) and the easiness of scission of X-Y linkage during heat-curing. $R^5$ of —NR5— is an alkyl group of 5 or less carbon atoms, and specific examples thereof are —$CH_3$, —$C_2H_5$, —$CH_2CH_2CH_3$, —$CH(CH_3)_2$, —$CH_2CH_2CH_2CH_3$, —$CH_2CH(CH_3)_2$, —$CH(CH_3)CH_2CH_3$, —$C(CH_3)_3$ and —$CH_2CH_2CH_2CH_2CH_3$.

In the general formula (1), Y is a monovalent organic group having 15 or less carbon atoms and, in view of the easiness of synthesis, includes monovalent organic groups having no carbon-to-carbon double bond, such as —$CH_3$, —$C_2H_5$, —$CH_2CH_2CH_3$, —$CH(CH_3)_2$, —$CH_2CH_2CH_2CH_3$, —$CH_2CH(CH_3)_2$, —$CH(CH_3)CH_2CH_3$, —$C(CH_3)_3$, —$CH_2CH_2OCOCH(CH_3)_2$, —$CH_2CH_2OCOC(CH_3)_3$, —$CH_2CH_2OCOCH_3$, —$CH_2CH_2OCOC_6H_5$, —$CH_2CH_2CH_2OCOC_6H_5$, —$CH_2CH_2OCH_3$, —$CH_2CH_2CH_2CH_3$, —$CH_2CH_2CH_2CH_2CH_3$, —$CH_2CH_2CH_2OCOC_6H_5$, —$CH_2CH_2CH_2OCH_3$, —$CH_2CH_2OCH_3$, —$CH_2CH_2CH_2OC_2H_5$, —$CH_2CH_2OC_2H_5$, —$CH_2CH_2CH_2OCH_2CH_2CH_3$, —$CH_2CH_2OCH_2CH_2CH_3$, —$CH_2CH_2CH_2OCH(CH_3)_2$, —$CH_2CH_2OCH(CH_3)_2$, —$CH_2CH_2CH_2OCH_2CH_2CH_2CH_3$, —$CH_2CH_2OCH_2CH_2CH_2CH_3$, —$CH_2CH_2CH_2OCH_2CH$ $(CH_3)_2$, —$CH_2CH_2OCH_2CH(CH_3)_2$, —$CH_2CH_2CH_2OC$ $(CH_3)3$, —$CH_2CH_2OC(CH_3)_3$, —$CH_2CH_2CH_2OC_6H_5$, —$CH_2CH_2OC_6H_5$ and the like. Of these, particularly preferred are —$CH_2CH_2OCOCH(CH_3)_2$, —$CH_2CH_2OCOC$ $(CH_3)_3$ and —$CH_2CH_2OCOCH_3$ in view of the easiness of synthesis and the easiness of scission between X and Y.

When $R^1$ is a trivalent aromatic group represented by the following structural formula (6), X is a bivalent organic group selected from —COO—, —NHCOO— and —NHCONH—, and Y is a monovalent organic group represented by one of the following general formulas (7), the polyimide precursor represented by the general formula (1) is, for example, a compound represented by the following general formula (8). The compound of general formula (8) has excellent heat resistance and adhesion and is suitable for use in the present invention.

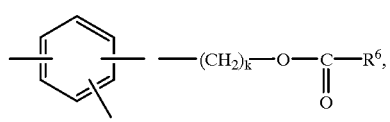
(6)

(7)

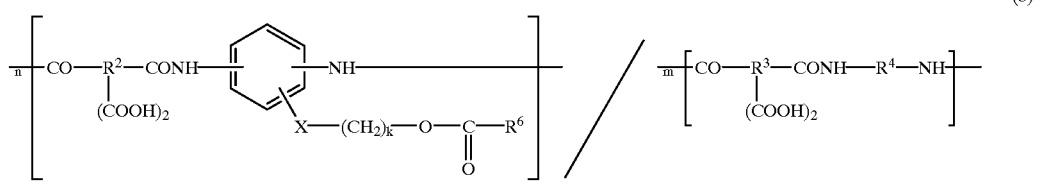
(8)

In the general formulas (7) and (8), k is an integer of 2–4. $R^6$ is a phenyl group or an alkyl group of 4 or less carbon atoms in view of the easiness of synthesis. Specific examples of $R_6$ are —$CH_3$, —$C_2H_5$, —$CH_2CH_2CH_3$, —$CH(CH_3)_2$, —CH$_2$CH$_2$CH$_2$CH$_3$, —CH$_2$CH(CH$_3$)$_2$, —CH(CH$_3$)CH$_2$CH$_3$, —C(CH$_3$)$_3$ and —C$_6$H$_5$. Of these groups, particularly preferred are —CH$_3$, —C$_2$H$_5$, —CH$_2$CH$_2$CH$_3$, —CH(CH$_3$)$_2$ and —C(CH3)3 because when R6 is such a group, the compound of the general formula (1) is easy to synthesize and Y of the (X-Y) linkage in the compound is easily eliminated from the linkage by heat-curing, easily decomposed, and removed from the system. R$^2$ and R$^3$ are each a tetravalent organic group having 4 or more carbon atoms; R$^4$ is a bivalent organic group having 4 or more carbon atoms; X is a bivalent organic group selected from —COO—, —NHCOO— and —NHCONH—; and n=5–100 and m=0–95 with a proviso that n+m=100.

Next, detailed description is made on the amine compound having a carbon-to-carbon double bond, used in the present invention. Said amine compound can be a compound represented by the following general formula (9), but is not restricted thereto.

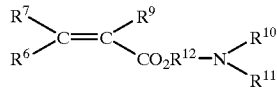

(9)

In the general formula (9), R$^7$, R$^8$ and R$^9$ are each independently a group selected from hydrogen, an alkyl group, a phenyl group, a vinyl group and a propenyl group; R$^{10}$ and R$^{11}$ are each independently a lower alkyl group; and R$^{12}$ is a lower alkylene group.

Specific examples of the compound represented by the general formula (9) are 2-(N,N-dimethylamino)-ethyl acrylate, 3-(N,N-dimethylamino)propyl acrylate, 4-(N,N-dimethylamino)butyl acrylate, 5-(N,N-dimethylamino)pentyl acrylate, 6-(N,N-dimethylamino)hexyl acrylate, 2-(N,N-diethylamino)ethyl acrylate, 3-(N,N-diethylamino)propyl acrylate, 4-(N,N-diethylamino)butyl acrylate, 5-(N,N-diethylamino)pentyl acrylate, 6-(N,N-diethylamino)hexyl acrylate, 2-(N,N-dimethylamino)ethyl methacrylate, 2-(N,N-dimethylamino)propyl methacrylate, 3-(N,N-dimethylamino)propyl methacrylate, 4-(N,N-dimethylamino)butyl methacrylate, 5-(N,N-dimethylamino)pentyl methacrylate, 6-(N,N-dimethylamino)hexyl methacrylate, 2-(N,N-diethylamino)ethyl methacrylate, 3-(N,N-diethylamino)propyl methacrylate, 4-(N,N-diethylamino)butyl methacrylate, 5-(N,N-diethylamino)pentyl methacrylate, 6-(N,N-diethylamino)hexyl methacrylate, 2-(N,N-dimethylamino)ethyl sorbate, 3-(N,N-dimethylamino)propyl sorbate, 4-(N,N-dimethylamino)butyl sorbate, 5-(N,N-dimethylamino)pentyl sorbate, 6-(N,N-dimethylamino)hexyl sorbate, 2-(N,N-diethylamino)ethyl sorbate, 3-(N,N-diethylamino)propyl sorbate, 4-(N,N-diethylamino)butyl sorbate, 5-(N,N-diethylamino)pentyl sorbate, 6-(N,N-diethylamino)hexyl sorbate, 2-(N,N-dimethylamino)ethyl cinnamate, 3-(N,N-dimethyl-mino)propyl cinnamate, 4-(N,N-dimethylamino)butyl innamate, 5-(N,N-dimethylamino)pentyl cinnamate, 6-(N,N-dimethylamino)hexyl cinnamate, 2-(N,N-diethylamino)ethyl cinnamate, 3-(N,N-diethylamino)propyl cinnamate, 4-(N,N-diethylamino)butyl cinnamate, 5-(N,N-diethylamino)pentyl cinnamate and 6-(N,N-diethylamino)hexyl cinnamate.

Of the above compounds, particularly preferred are 2-(N,N-dimethylamino)ethyl methacrylate, 3-(N,N-dimethylamino)propyl methacrylate, 4-(N,N-dimethylamino)butyl methacrylate, 5-(N,N-dimethylamino)pentyl methacrylate, 6-(N,N-dimethylamino)hexyl methacrylate, 2-(N,N-diethylamino)ethyl methacrylate, 3-(N,N-diethylamino)propyl methacrylate, 4-(N,N-diethylamino)butyl methacrylate, 5-(N,N-diethylamino)pentyl methacrylate and 6-(N,N-diethylamino)hexyl methacrylate, because they can impart good photosensitivity.

The amount used of the amine compound having a carbon-to-carbon double bond is preferably 1–400 parts by weight, more preferably 10–200 parts by weight per 100 parts by weight of the polyimide precursor having a recurring unit constitution of the general formula (1). When the amount of the amine compound deviates from this range, the resulting photosensitivity is insufficient and the developability or stability of the resulting film are affected adversely.

Detailed description is made on the photosensitizer used in the present invention. As the photosensitizer, there can be mentioned a photosensitizing agent, a photopolymerization initiator, a photosensitizing aid, a photopolymerization aid, etc. They can be used singly or in combination of two or more.

In the present invention, there can be used, as the photosensitizer, photosensitizing agents such as Michler's ketone, bis-4,4'-diethylaminobenzophenone, benzophenone, 3,5-bis(diethylaminobenzylidene)-N-methyl-4-piperidone, 3,5-bis(dimethylaminobenzylidene)-N-methyl-4-piperidone, 3,5-bis(diethylaminobenzylidene)-N-ethyl-4-piperidone, 3,3'-carbonylbis(7-diethylamino)-coumarin, riboflavin tetrabutylate, 2-methyl-1-[4-(methylthio)phenyl]-2-morpholinopropan-1-one, 2,4-dimethylthioxanthone, 2,4-diisopropylthioxanthone, 3,5-dimethylthioxanthone, 3,5-diisopropylthioxanthone, 1-phenyl-2-(ethoxycarbonyl)oxyiminopropan-1-one, benzoin ether, benzoin isopropyl ether, 1,9-benzanthrone, 5-nitroacenaphthene, 5-nitro-1-acetonaphthone, 5-nitro-2-acetonaphthone, 2-nitrofluorene, anthrone, 1,2-benzanthraquinone, 1-phenyl-5-mercapto-1H-tetrazole, thioxanthen-9-one, 10-thioxanthenone, 3-acetylindole, 2,6-di(p-dimethylaminobenzal)-4-carboxycyclohexanone, 2,6-di(p-dimethylaminobenzal)-4-hydroxycyclohexanone, 2,6-di(p-diethylaminobenzal)-4-carboxycyclohexanone, 2,6-di(p-diethylaminobenzal)-4-hydroxycyclohexanone, 4,6-dimethyl-7-ethylaminocoumarin, 7-diethylamino-4-methylcoumarin, 7-diethylamino-3-(1-methylbenzimidazolyl)coumarin, 3-(2-benzimidazolyl)-7-diethylaminocoumarin, 3-(2-benzothiazolyl)-7-diethylaminocoumarin, 2-(p-dimethylaminostyryl)benzoxazole, 2-(p-dimethylaminostyryl)quionline, 4-(p-dimethylaminostyryl)quinoline, 2-(p-dimethylaminostyryl)benzothiazole and 2-(p-dimethylaminostyryl)-3,3-dimethyl-3H-indole. These compounds can be used singly or in combination of two or more.

Of the above compounds, preferred are Michler's ketone, bis-4,4'-diethylaminobenzophenone, 3,5-bis(diethylaminobenzylidene)-N-methyl-4-piperidone, 3,5-bis(dimethylaminobenzylidene)-N-methyl-4-piperidone, 3,5-bis(diethylaminobenzylidene)-N-ethyl-4-piperidone, 3,3'-carbonylbis(7-diethylamino)coumarin, riboflavin tetrabutylate, 2-methyl-1-[4-(methylthio)phenyl]-2-morpholinopropan-1-one, 2,4-dimethylthioxanthone, 2,4-diisopropylthioxanthone, 3,5-dimethylthioxanthone, 3,5-diisopropylthioxanthone, 1-phenyl-2-(ethoxycarbonyl)oxyiminopropan-1-one, 5-nitroacenaphthene, 2,6-di(p-dimethylaminobenzal)-4-carboxycyclohexanone, 2,6-di(p-dimethylaminobenzal)-4-hydroxycyclohexanone, 2,6-di(p-diethylaminobenzal)-4-carboxycyclohexanone, 2,6-di(p-diethylaminobenzal)-4-hydroxycyclohexanone, 4,6-dimethyl-7-ethylaminocoumarin, 7-diethylamino-4- methylcoumarin, 7-diethylamino-3-(1-methylbenzimidazolyl)coumarin, 3-(2-benzimidazolyl)-7-diethylaminocoumarin and 3-(2-benzothiazolyl)-7-diethylaminocoumarin.

As the photosensitizer of the present invention, there can also be used photosensitizing aids such as 4-diethylaminoethyl benzoate, 4-dimethylaminoethyl benzoate, 4-diethylaminopropyl benzoate, 4-dimethylaminopropyl benzoate, 4-dimethylaminoisoamyl benzoate, N-phenylglycine, N-methyl-N-phenylglycine, N-(4-cyanophenyl)glycine, 4-dimethylaminobenzonitrile, ethylene glycol dithioglycolate, ethylene glycol di(3-mercaptopropionate), trimethylolpropane thioglycolate, trimethylolpropane tri(3-mercaptopropionate), pentaerythritol tetrathioglycolate, pentaerythritol tetra(3-mercaptopropionate), trimethylolethane trithioglycolate, trimethylolpropane trithioglycolate, trimethylolethane tri(3-mercaptopropionate), dipentaerythritol hexa(3-mercaptopropionate), thioglycolic acid, α-mercaptopropionic acid, t-butyl peroxybenzoate, t-butyl peroxymethoxybenzoate, t-butyl peroxynitrobenzoate, t-butyl peroxyethylbenzoate, phenylisopropyl peroxybenzoate, di-t-butyl diperoxyisophthalate, trit-butyl triperoxytrimellitate, tri-t-butyl triperoxytrimesitate, tetra-t-butyl tetraperoxypyromellitate, 2,5-dimethyl-2,5-di(benzoylperoxy)hexane, 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 2,6-di(p-azidobenzal)-4-hydroxycyclohexanone, 2,6-di(p-azidobenzal)-4-carboxycyclohexanone, 2,6-di(p-azidobenzal)-4-methoxycyclohexanone, 2,6-di(p-azidobenzal)-4-hydroxymethylcyclohexanone, 3,5-di(p-azidobenzal)-1-methyl-4-piperidone, 3,5-di(p-azidobenzal)-4-piperidone, 3,5-di(p-azidobenzal)-N-acetyl-4-piperidone, 3,5-di(p-azidobenzal)-N-methoxycarbonyl-4-piperidone, 2,6-di(p-azidobenzal)-4-hydroxycyclohexanone, 2,6-di(m-azidobenzal)-4-carboxycyclohexanone, 2,6-di(m-azidobenzal)-4-methoxycyclohexanone, 2,6-di(m-azidobenzal)-4-hydroxymethylcyclohexanone, 3,5-di(m-azidobenzal)-N-methyl-4-piperidone, 3,5-di(m-azidobenzal)-4-piperidone, 3,5-di(m-azidobenzal)-N-acetyl-4-piperidone, 3,5-di(m-azidobenzal)-N-methoxycarbonyl-4-piperidone, 2,6-di(p-azidocinnamylidene)-4-hydroxycyclohexanone, 2,6-di(p-azidocinnamylidene)-4-carboxycyclohexanone, 2,6-di(p-azidocinnamylidene)-4-hydroxymethylcyclohexanone, 3,5-di(p-azidocinnamylidene)-N-methyl-4-piperidone, 4,4'-diazidochalcone, 3,3'-diazidochalcone, 3,4'-diazidochalcone, 4,3'-diazidochalcone, 1,3-diphenyl-1,2,3-propanetrione-2-(o-acetyl) oxime, 1,3-diphenyl-1,2,3-propanetrione-2-(o-n-propylcarbonyl) oxime, 1,3-diphenyl-1,2,3-propanetrione-2-(o-methoxycarbonyl) oxime, 1,3-diphenyl-1,2,3-propanetrione-2-(o-ethoxycarbonyl) oxime, 1,3-diphenyl-1,2,3-propanetrione-2-(o-benzoyl) oxime, 1,3-diphenyl-1,2,3-propanetrione-2-(o-phenyloxycarbonyl) oxime, 1,3-bis(p-methylphenyl)-1,2,3-propanetrione-2-(o-benzoyl) oxime, 1,3-bis(p-methylphenyl)-1,2,3-propanetrione-2-(o-ethoxycarbonyl) oxime, 1-(p-methoxyphenyl)-3-(p-nitrophenyl)-1,2,3-propanetrione-2-(o-phenyloxycarbonyl) oxime and the like. These compounds can be used singly or in combination of two or more.

Of these photosensitizing aids, particularly preferred are 4-diethylaminoethyl benzoate, 4-dimethylaminoethyl benzoate, 4-dimethylaminoisoamyl benzoate, N-phenylglycine, N-methyl-N-phenylglycine, N-(4-cyanophenyl)glycine, 4-dimethylaminobenzonitrile, pentaerythritol tetrathioglycolate, pentaerythritol tetra(3-mercaptopropionate), trimethylolethane trithioglycolate, trimethylolpropane trithioglycolate, trimethylolethane tri(3-mercaptopropionate), thioglycolic acid, t-butyl peroxymethoxybenzoate, t-butyl peroxynitrobenzoate, t-butyl peroxyethylbenzoate, phenylisopropyl peroxybenzoate, di-t-butyl diperoxyisophthalate, tri-t-butyl triperoxytrimellitate, tri-t-butyl triperoxytrimesitate, tetra-t-butyl tetraperoxypyromellitate, 2,5-dimethyl-2,5-di(benzoylperoxy)hexane, 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone and 1,3-diphenyl-1,2,3-propanetrione-2-(o-ethoxycarbonyl) oxime.

As the photosensitizer of the present invention, there can also be used photopolymerization initiators such as acridine, nitropyrene, 1,8-dinitropyrene, pyrene-1,6-quinone-9-fluorene, anthanthrone, 2-chloro-1,2-benzanthraquinone, 2-bromobenzanthraquinone, 3,5-diethylthioxanthone, benzil, 3-acetylphenanthrene, 1-indanone, 7-H-benz[de]anthracene-7-one, 1-naphthaldehyde and the like. These compounds can be used singly or in combination of two or more.

Of the above photosensitizers, preferred are 4-diethylaminoethyl benzoate, 4-dimethylaminoethyl benzoate, 4-dimethylaminoisoamyl benzoate, N-phenylglycine, N-methyl-N-phenylglycine, N-(4-cyanophenyl)glycine, 4-dimethylaminobenzonitrile, pentaerythritol tetrathioglycolate, pentaerythritol tetra(3-mercaptopropionate), trimethylolethane trithioglycolate, trimethylolpropane trithioglycolate, trimethylolethane tri(3-mercaptopropionate), thioglycolic acid, t-butyl peroxymethoxybenzoate, t-butyl peroxynitrobenzoate, t-butyl peroxyethylbenzoate, phenylisopropyl peroxybenzoate, di-t-butyl diperoxyisophthalate, tri-t-butyl triperoxytrimellitate, tri-t-butyl triperoxytrimesitate, tetra-t-butyl tetraperoxypyromellitate, 2,5-dimethyl-2,5-di(benzoylperoxy)hexane, 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone and 1,3-diphenyl-1,2,3-propanetrione-2-(o-ethoxycarbonyl) oxime.

The amount of the photosensitizer used is preferably 0.1–30 parts by weight, more preferably 0.3–20 parts by weight per 100 parts by weight of the polyimide precursor. When the amount deviates from the above range, no photosensitizing effect is obtained, or developability is affected adversely.

The polyimide precursor composition used in the present invention may contain a solvent in order to have a viscosity necessary for coating. The solvent is desirably an aprotic polar solvent in view of the solvency. Specific examples of the solvent are N-methyl-2-pyrrolidone, N-acetyl-2-pyrrolidone, N-benzyl-2-pyrrolidone, N,N-dimethylformamide, N,N-dimethylacetamide, dimethyl sulfoxide, hexamethylphosphoric triamide, N-acetyl-ε-caprolactam, dimethylimidazolidinone, diethylene glycol dimethyl ether, triethylene glycol dimethyl ether and γ-butyrolactone. These compounds may be used singly or in combination of two or more. In order to improve coatability, it is possible to add, to the above solvent, an aromatic solvent such as toluene, xylene, methoxybenzene or the like as long as dissolution of polymer is not adversely affected by the addition.

In the present invention, coating of the polyimide precursor or the polyimide precursor composition both of solution state can be conducted by various methods such as spin coating using a spinner, dipping, spray printing, screen printing and the like. The thickness of coating can be controlled by the conditions of coating or the solid content in solution. After coating, drying is conducted to obtain a coating film on a silicon chip, after which heat-curing is conducted.

It is possible to form, from the photosensitivity imparted polyimide precursor composition of the present invention, a film of pattern shape by ordinary photolithography. That is, said polyimide precursor composition is coated on a semiconductor element and dried to form a film on the semiconductor element; the film is irradiated with ultraviolet rays through a photomask; the non-irradiated portion of the film is dissolved with a developer and removed; thereby, a desired relief pattern can be formed on the semiconductor element. The drying of coated composition is conducted desirably at a temperature selected from the range of 50–120° C. When the drying temperature is lower than 50° C., a long time is required for vaporization of solvent or drying becomes insufficient. When the drying temperature is higher than 120° C., a thermal reaction takes place and invites partial crosslinking and developability of film is impaired.

As the developer, there can be used a good solvent for the composition of the present invention, such as N-methyl-2-pyrrolidone, N-acetyl-2-pyrrolidone, N-benzyl-2-pyrrolidone, N,N-dimethylformamide, N,N-dimethylacetamide, dimethyl sulfoxide, hexamethylphosphoric triamide, N-acetyl-ε-caprolactam, dimethylimidazolidinone, diethylene glycol dimethyl ether, triethylene glycol dimethyl ether, γ-butyrolactone or the like; or a mixture of the above good solvent and a non-solvent for the present composition, such as methanol, ethanol, isopropyl alcohol, toluene, xylene, 1,2-dimethoxyethane, 2-methoxyethanol, 1-acetoxy-2-methoxyethane, water or the like.

The relief pattern formed by development is washed with a rinsing solution to remove the developer. The rinsing solution has good miscibility with the developer, and preferred examples thereof are methanol, ethanol, isopropyl alcohol, toluene, xylene, 1,2-dimethoxyethane, 2-methoxyethanol, 1-acetoxy-2-methoxyethane and water.

The thus-obtained polyimide precursor film is heated at a temperature selected from the range of 200–450° C., whereby a polyimide having excellent heat resistance and physical properties is obtained. When the heating temperature is lower than 200° C., no imide ring formation reaction takes place, or the reaction is extremely slow. When the temperature is higher than 450° C., the cured material causes thermal decomposition. When a temperature higher than 300° C. is used, it is desirable to conduct heating in an inert gas atmosphere such as $N_2$ or the like.

Investigation by the present inventors on the cracking of sealing member in conventional resin-sealed semiconductor device indicated that peeling occurs at the interface between the protecting film (made of a polyimide resin) formed on semiconductor element and the sealing member (made of a molding resin) and this incurs cracking of the sealing member. The reason therefor is presumed to be that the adhesion between the polyimide resin and the molding resin is inferior.

In the present semiconductor device and the present process for production thereof, a polyimide film is formed with a polyimide precursor having polar substituents as the side chains and this film has improved adhesion to the sealing resin of semiconductor device because the polar substituents have an interaction with the sealing resin. Owing to this improved adhesion, the present semiconductor device produced by the present process is free from peeling between the protecting film on semiconductor element and the sealing member, or from cracking of the sealing member.

The present invention is hereinafter described with reference to Examples. In the following Examples, viscosity was measured at 25° C. by the use of a Brookfield type viscometer (DVR-E Model manufactured by TOKIMEC INC.).

SYNTHESIS EXAMPLE 1

There was synthesized a polyimide precursor having a recurring unit constitution represented by the following chemical formula (10) (said polyimide precursor is hereinafter referred to as compound 1).

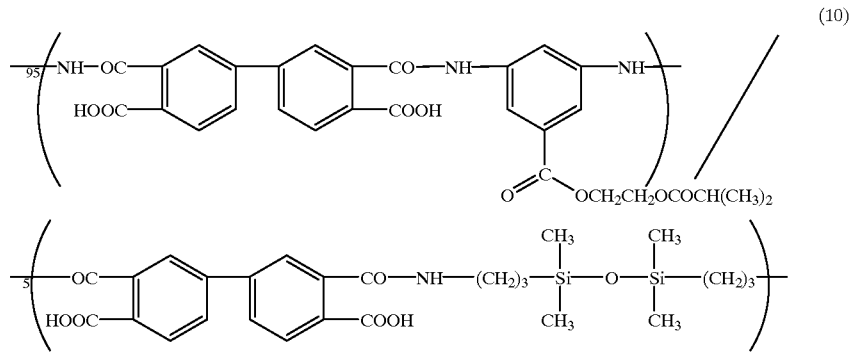

(1) Synthesis of Diamine Compound 2-(3,5-Diaminobenzoyloxy)ethyl isobutyrate (compound 4) was synthesized in two stages according to the following reaction scheme (11).

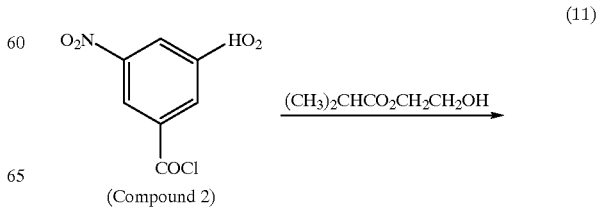

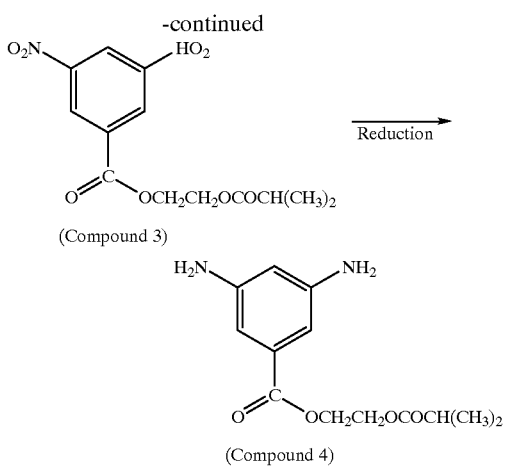

(Compound 3)

(Compound 4)

83 g ((0.36 mol) of 3,5-dinitrobenzoyl chloride (compound 2) and 28 g (0.36 mol) of pyridine were placed in a 1-l four-necked flask equipped with a dropping funnel, a reflux condenser, a thermometer and a mixing blade. Thereto was added 100 ml of dichloromethane for dissolution. The flask was cooled to 10° C. with ice water. Thereto was dropwise added, in 20 minutes with the temperature (10° C.) being maintained, 62 g (0.47 mol) of 2-hydroxyethyl 2-methylpropionate. After the dropwise addition, the flask was immersed in an oil bath of 50° C. and the flask contents were stirred for 1 hour. The flask was cooled to room temperature and 50 ml of water was added, followed by stirring for several minutes. All the flask contents were transferred into a separating funnel and the aqueous layer was separated to remove. The organic layer taken out was returned to the separating funnel. Thereto was added a 5% aqueous sodium carbonate solution, followed by mixing. The lower layer (organic layer) was taken out and dried over anhydrous magnesium sulfate. From the dried solution was removed dichloromethane by distillation by the use of an evaporator, whereby a solid was separated. The solid was recrystallized from a mixed solvent consisting of 200 ml of methanol and 100 ml of water to obtain 2-(3,5-dinitrobenzoyloxy)ethyl isobutyrate (compound 3). Yield: 100 g (86%) Melting point: 55–58° C.

9 g of 5% palladium carbon, 90 g (0.27 mol) of 2-(3,5-dinitrobenzoyloxy)ethyl isobutyrate (compound 3) and 900 ml of ethanol were placed in a 5-l autoclave equipped with a thermocouple thermometer and a mixing blade, and the autoclave was sealed. The atmosphere inside the autoclave was replaced by hydrogen and the hydrogen pressure was increased to 5 kg/cm$^2$. The autoclave contents were stirred at room temperature (7° C.). 10 minutes later, the autoclave inside temperature rose to 34° C. and the autoclave inside pressure dropped to 1 kg/cm$^2$. Then, hydrogen was introduced to raise the pressure to 5 kg/cm$^2$, and stirring was continued. Ten minutes later, the temperature became 50° C. and the pressure dropped to 1 kg/cm$^2$. Hydrogen was again introduced to raise the pressure to 5 kg/cm$^2$, and stirring was continued. Since the temperature began to drop and the pressure became constant (4 kg/cm$^2$), stirring was continued for 100 minutes (the temperature dropped to 18° C.). The atmosphere inside the autoclave was replaced by nitrogen, and the autoclave contents were taken out and filtered to remove palladium carbon. The filtrate was concentrated by the use of an evaporator, whereby a solid was separated. The solid was recrystallized from 200 ml of toluene to obtain 2-(3,5-diaminobenzoyloxy)ethyl isobutyrate (compound 4). Yield: 60 g (83%) Melting point: 81–83° C.

The structure of the compound 4 was confirmed by the infrared absorption (IR) spectrum and proton NMR (H$^1$-NMR) spectrum. The results are shown in Table 1.

TABLE 1

Characterization of diamine compounds

| No. of compound | Name of compound | R$^{13}$ | Melting point (° C.) | Infrared absorption spectrum cm$^{-1}$ (KBr disc) | Nuclear magnetic resonance spectrum δ(H$^1$-NMR) Solvent Nos. 4, 17 & 18 = CDCl$_3$ Nos. 19 & 20 = DMSO-d$_6$ |
|---|---|---|---|---|---|
| 4 | 2-(3',5'-Diamino-benzoyloxy)-ethyl isobutyrate | —CH$_2$CH$_2$OCOCH(CH$_3$)$_2$ | 81–83 | 3440 (—NH$_2$), 3360 (—NH$_2$), 1735 (>C=O), 1705 (>C=O) | 1.17(d, 6H, —CH$_3$), 2.58(m, 1H, —CH<), 3.68(br. s, 4H, —NH$_2$), 4.38–4.41(m, 2H, —CH$_2$—), 4.45–4.48(m, 2H, —CH$_2$—), 6.20(t, 1H, aromatic), 6.77(d, 2H, aromatic) |
| 17 | 2-(3',5'-Diamino-benzoyloxy)-ethyl acetate | —CH$_2$CH$_2$OCOCH$_3$ | 76–77 | 3460 (—NH$_2$), 3370 (—NH$_2$), 1745 (>C=O), 1730 (>=0), | 2.09(s, 3H, —CH$_3$), 3.68(br. s, 4H, —NH$_2$), 4.37–4.40(m, 2H, —CH$_2$—), 4.44–4.47(m, 2H, —CH$_2$—), 6.20(t, 1H, aromatic), 6.78(d, 2H, aromatic) |
| 18 | 2-(3',5'-Diamino-benzoyloxy)-ethyl pivalate | —CH$_2$CH$_2$OCOC(CH$_3$)$_3$ | 73–75 | 3440 (—NH$_2$), 3370 (—NH$_2$), 1735 (>C=O), 1720 (>C=O) | 1.20(s, 9H, —CH$_3$), 3.68(br. s, 4H, —NH$_2$), 4.37–4.39(m, 2H, —CH$_2$—), 4.46–4.48(m, 2H, —CH$_2$—), 6.19(t, 1H, aromatic), 6.77(d, 2H, aromatic) |
| 19 | 2-(3',5'-Diamino- | —CH$_2$CH$_2$OCOC$_6$H$_5$ | 94–96 | 3460 (—NH$_2$), 3400 (—NH$_2$), | 3.34(br. s, 4H, —NH$_2$), 4.56(m, 4H, —CH$_2$CH$_2$—), |

TABLE 1-continued

Characterization of diamine compounds

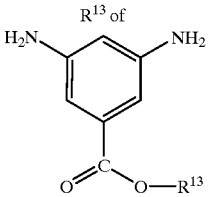

| No. of compound | Name of compound | $R^{13}$ of | Melting point (°C.) | Infrared absorption spectrum cm$^{-1}$ (KBr disc) | Nuclear magnetic resonance spectrum $\delta(H^1\text{-NMR})$ (Solvent Nos. 4, 17 & 18 = CDCl$_3$ Nos. 19 & 20 = DMSO-d$_6$) |
|---|---|---|---|---|---|
| | benzoyloxy)-ethyl benzoate | | | 1730 (>C=O) | 6.23(t, 1H, aromatic), 6.63(d, 2H, aromatic), 7.53(m, 2H, aromatic), 7.66(m, 1H, aromatic), 7.97(m, 1H, aromatic) |
| 20 | 2-(3',5'-Diamino-benzoyloxy)-propyl benzoate | —CH$_2$CH$_2$CH$_2$OCOC$_6$H$_5$ | 60–65 | 3420 (—NH$_2$), 3325 (—NH$_2$), 1725 (>C=O) | 3.37(br. s, 4H, —NH$_2$), 4.40(m, 4H, —(CH$_2$)$_3$—), 6.22(t, 1H, aromatic), 6.63(d, 2H, aromatic), 7.53(m, 2H, aromatic), 7.66(m, 1H, aromatic), 7.97(m, 1H, aromatic) |

(2) Synthesis of Polyimide Precursor

Using the above-obtained diamine (compound 4), there was synthesized a polyamic acid (a polyimide precursor) according to the following reaction formula (12).

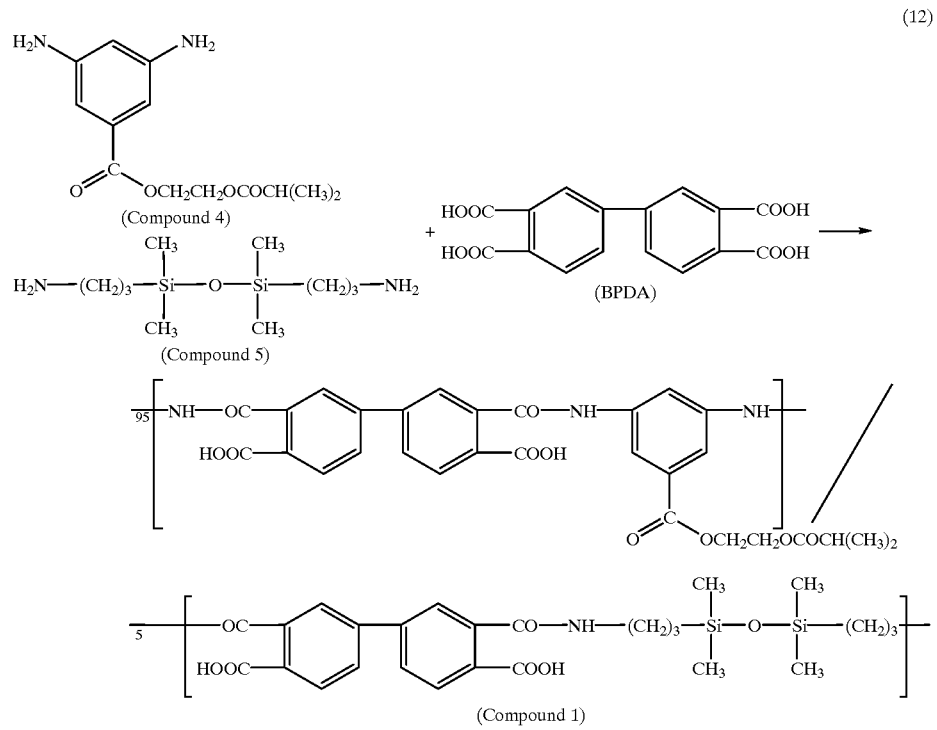

32.72 g of N-methyl-2-pyrrolidone (hereinafter abbreviated to NMP) dehydrated and dried with calcium hydride was placed as a solvent in a 100-ml four-necked flask equipped with a thermometer and a mixing blade (motor-driven). Thereto were added 4.921 g (0.0185 mol) of the diamine (compound 4) and 0.2425 g (0.000976 mol) of bis(3-aminopropyl)tetramethyldisiloxane (compound 5), followed by stirring for dissolution. To the resulting solution was added, in small portions, 5.742 g (0.0195 mol) of powdery biphenyltetracarboxylic acid dianhydride (BPDA). During the addition, the liquid temperature rose to 35° C.; one hour later, the temperature dropped to room temperature; 2 hours later, BPDA dissolved completely. Then, stirring was conducted at room temperature for 4 hours and the viscosity of the solution became 3.10 Pa·s. The solution (solid content=25%) was filtered under pressure through a filter having pores of 5 μm to obtain an intended polyamic acid (compound 1).

SYNTHESIS EXAMPLE 2

There was synthesized a polyimide precursor having a recurring unit constitution represented by the following chemical formula (13) (said polyimide precursor is hereinafter referred to as compound 6).

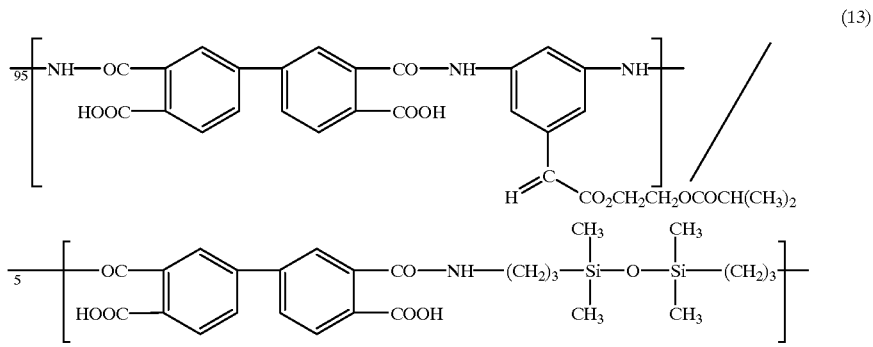

(1) Synthesis of Diamine Compound 2-(3,5-diaminophenylcarbamoyloxy)ethyl isobutyrate (compound 9) was synthesized in two stages according to the following reaction scheme (14).

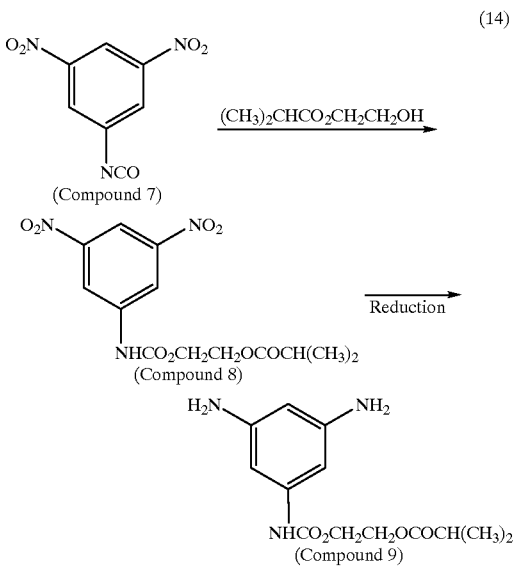

19.5 g (0.0822 mol) of 3,5-dinitrophenyl carbonyl azide was placed, in a nitrogen current, in a 0.3-l four-necked flask equipped with a nitrogen inlet tube, a dropping funnel, a reflux condenser, a thermometer and a mixing blade. Thereto was added acetonitrile for dissolution and the total amount was made 50 ml. The flask contents were heated for refluxing to obtain 50 ml of an acetonitrile solution containing 3,5-dinitrophenyl isocyanate (compound 7). While the flask was being cooled with ice water, 12.0 g (0.0909 mol) of 2-hydroxyethyl 2-methylpropionate was dropwise added to the flask contents with stirring. After the dropwise addition, stirring was conducted at room temperature for 2 hours; 50 ml of water was added; and stirring was conducted for several minutes. Then, dichloromethane was added. All the flask contents were transferred into a separating funnel for separation of the aqueous layer. The organic layer taken out was returned to the separating funnel. Thereto was added a 5% aqueous sodium carbonate solution, followed by mixing. The lower layer (organic layer) was taken out and dried over anhydrous magnesium sulfate. From the dried solution was removed dichloromethane by distillation by the use of an evaporator, whereby a solid was separated. The solid was recrystallized from butanol to obtain 2-(3,5-dinitrophenylcarbamoyloxy)ethyl isobutyrate (compound 8) as a yellow powder. Yield: 14.4 g (50%) Melting point: 94–95° C.

4.8 g of 5% palladium carbon, 48.0 g (0.141 mol) of 2-(3,5-dinitrophenylcarbamoyloxy)ethyl isobutyrate (compound 8) and 700 ml of ethanol were placed in a 5-l autoclave equipped with a thermocouple thermometer and a mixing blade, and the autoclave was sealed. The atmosphere inside the autoclave was replaced by hydrogen and the hydrogen pressure was raised to 5 kg/cm². The autoclave contents were stirred at room temperature (20° C.). Ten minutes later, the autoclave inside temperature rose to 34° C. and the autoclave inside pressure dropped to 1 kg/cm². Then, hydrogen was introduced to raise the pressure to 5 kg/cm², and stirring was continued. 20 minutes later, the temperature became 30° C. and the pressure dropped to 2.5 kg/cm². Hydrogen was again introduced to raise the pressure to 5 kg/cm², and stirring was continued. Since the temperature began to drop and the pressure became constant (3 kg/cm²), stirring was continued for 70 minutes (the temperature dropped to 23° C.). The atmosphere inside the autoclave was replaced by nitrogen, and the autoclave contents were taken out and filtered to remove palladium carbon. The filtrate was concentrated by the use of an evaporator. The resulting concentrate was placed under reduced pressure by the use of a rotary pump to distil off the solvent to obtain 2-(3,5-diaminophenylcarbamoyloxy)ethyl isobutyrate (compound 9) as a brown viscous liquid. Yield: 33.7 g (85%)

The structure of the compound 9 was confirmed by the infrared absorption (IR) spectrum and proton NMR (H¹-NMR) spectrum. The results are shown in Table 2.

TABLE 2

Characterization of diamine compounds

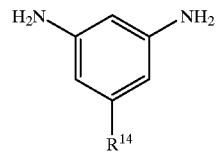

| No. of compound | Name of compound | $R^{14}$ of (structure above) | Melting point (° C.) | Infrared absorption spectrum cm$^{-1}$ | Nuclear magnetic resonance spectrum δ (H$^1$-NMR) (Solvent No. 9 = CDCl$_3$, No. 13 = (CD$_3$)$_2$CO) |
|---|---|---|---|---|---|
| 9 | 2-(3,5-diamino-phenylcarba-moyloxy)ethyl isobutyrate | —NHCOO(CH$_2$)$_2$OCOCH(CH$_3$)$_2$ | oily | 3420(—NH$_2$), 3330(—NH$_2$), 1710(>C=0), | 1.17 (d, 6H, —CH$_3$), 2.58(m, 1H, —CH<), 3.58(s, 4H, —NH$_2$), 4.30(s, 4H, —CH$_2$CH$_2$—), 5.73(s, 1H, aromatic), 6.15(s, 2H, aromatic), 6.61(s, 1H, —NH—) |
| 13 | 2-(3,5-diamino-phenylureido)-ethyl isobutyrate | —NHCONH(CH$_2$)$_2$OCOCH(CH$_3$)$_2$ | 89–90 | 3450(—NH$_2$), 3300(—NH$_2$), 1730(>C=0) (KBr disc) | 1.12(d, 6H, —CH$_3$), 2.53(m, 1H, —CH<), 3.42(br. t, 2H, —CH$_2$—), 4.10(t, 2H, —CH$_2$—), 4.18(br. s, 4H, —NH$_2$), 5.66(s, 1H, aromatic), 5.90(s, 1H, —NH—), 6.13(s, 2H, aromatic), 7.52(s, 1H, —NH—) |

(2) Synthesis of Polyimide Precursor

Using the above-obtained 2-(3,5-diaminophenylcarbamoyloxy)ethyl isobutyrate (compound 9), there was synthesized a polyamic acid (a polyimide precursor) according to the following reaction formula (15).

32.8 g of NMP dehydrated and dried with calcium hydride was placed as a solvent in a 100-ml four-necked flask equipped with a thermometer and a mixing blade (motor-driven). Thereto were added 5.181 g (0.0185 mol) of the diamine (compound 9) and 0.2425 g (0.000976 mol) of bis(3-aminopropyl)tetramethyldisiloxane (compound 5),

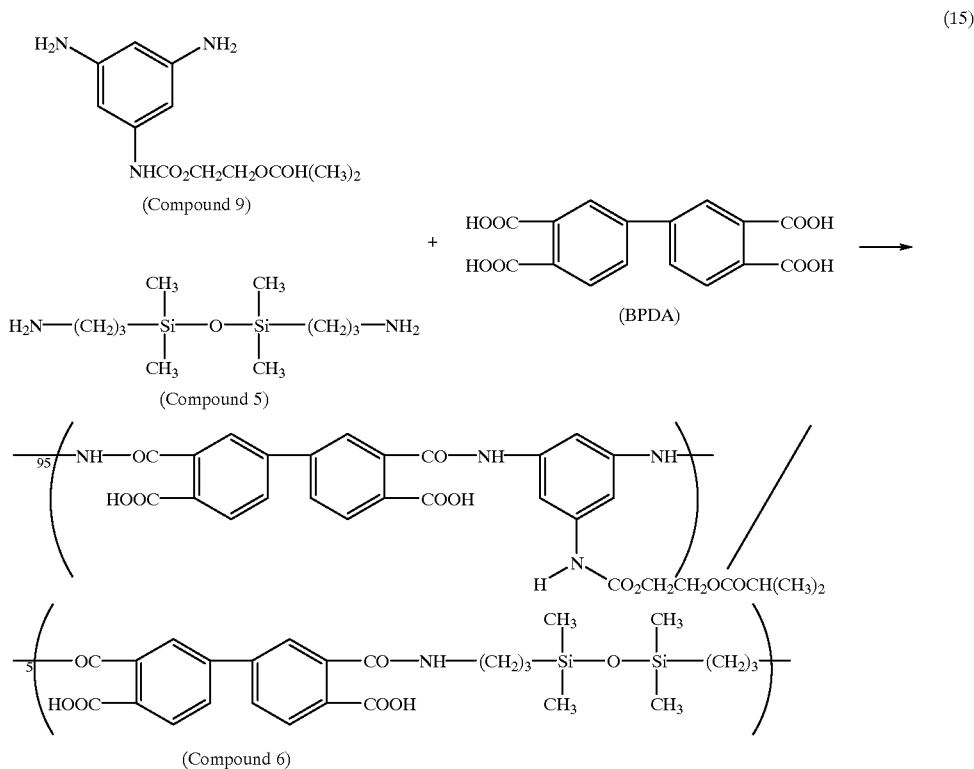

(15)

followed by stirring for dissolution. To the resulting solution was added, in small portions, 5.742 g (0.0195 mol) of powdery BPDA.

During the addition, the liquid temperature rose to 35° C.; one hour later, the temperature dropped to room temperature; 2 hours later, BPDA dissolved completely. Then, stirring was conducted at room temperature for 4 hours and the viscosity of the solution became 3.10 Pa·s. The solution (solid content=25%) was filtered under pressure through a filter having pores of 5 μm to obtain an intended polyamic acid (compound 6).

SYNTHESIS EXAMPLE 3

There was synthesized a polyimide precursor having a recurring unit constitution represented by the following chemical formula (16) (said polyimide precursor is hereinafter referred to as compound 10).

-continued

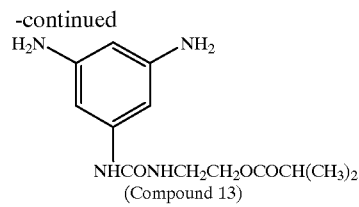
(Compound 13)

Acetonitrile was added to 19.5 g (0.0822 mol) of 3,5-dinitrophenyl carbonyl azide in a nitrogen current for dissolution and the total volume was made 50 ml. The resulting solution was heated for refluxing to obtain 50 ml of an acetonitrile solution containing 3,5-dinitrophenyl isocyanate (compound 7).

11.0 g (0.180 mol) of 2-aminoethanol was placed, in a nitrogen current, in a 0.3-l four-necked flask equipped with a nitrogen inlet tube, a dropping funnel, a reflux condenser,

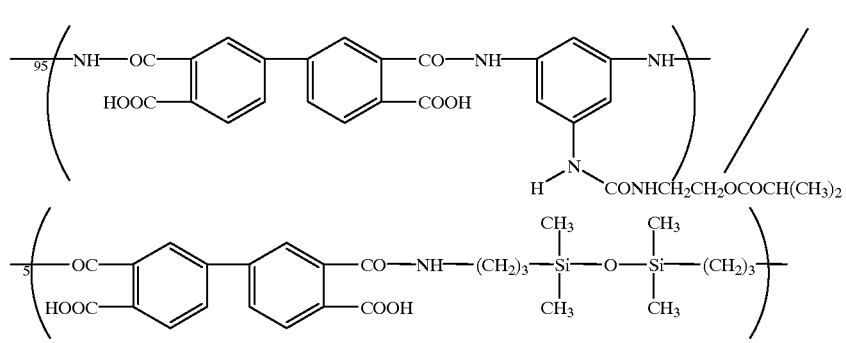

(1) Synthesis of Diamine Compound

There was synthesized 2-(3,5-diaminophenylureido)ethyl isobutyrate (compound 13) in three stages according to the following reaction scheme (17).

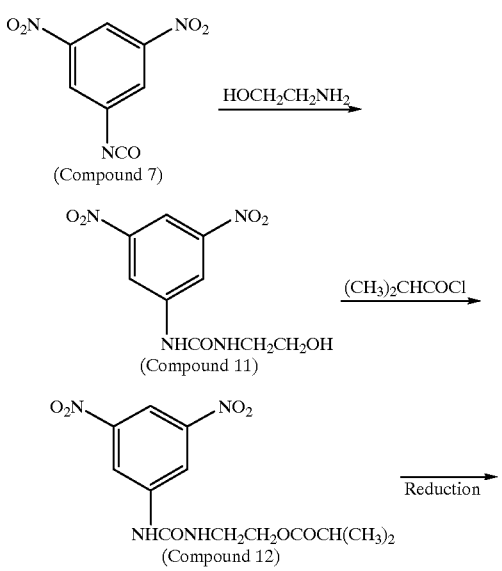

a thermometer and a mixing blade. Thereto was added 50 ml of acetonitrile, followed by stirring for dissolution. While the flask was being cooled with ice water, the flask contents were stirred. Thereto was dropwise added 50 ml of the above-obtained acetonitrile solution containing 3,5-dinitrophenyl isocyanate (compound 7). The mixture was stirred at room temperature for 1 hour and then poured into 0.7 l of water. The separated crystals were collected by suction filtration, washed with water and vacuum-dried at 35° C. for 12 hours to obtain N-(3,5-dinitrophenyl)-N'-(2-hydroxyethyl)urea (compound 11) as a yellow powder. Yield: 16.7 g (74%) Melting point: 192–194° C.

In a 0.3-l four-necked flask equipped with a dropping funnel, a reflux condenser, a thermometer and a mixing blade were placed 18.0 g (0.0666 mol) of N-(3,5-dinitrophenyl)-N'-(2-hydroxyethyl)urea (compound 11) and 5.27 g (0.0666 mol) of pyridine. Thereto was added 150 ml of dichloromethane. The mixture was stirred and became a yellow suspension. While the flask was being cooled with ice water, the flask contents were stirred. Thereto was dropwise added 8.52 g (0.0799 mol) of isobutyryl chloride. After the dropwise addition, the flask was immersed in an oil bath of 40° C. and the flask contents were stirred for 1 hour. Then, the flask contents were cooled to room temperature. Thereto was added 50 ml of water, and the mixture was stirred for several minutes. All the flask contents were transferred into a separating funnel for separation of the aqueous layer. The organic layer taken out was returned to the separating funnel. Thereto was added a 5% aqueous sodium carbonate solution, followed by mixing. The lower layer (organic layer) was taken out and dried over anhydrous magnesium sulfate. From the dried solution was removed dichloromethane by distillation by the use of an evaporator, whereby a solid was separated. The solid was recrystallized from a 2:1 mixed solvent consisting of methanol and water to obtain 2-(3,5-dinitrophenylureido)ethyl isobutyrate (compound 12) as a yellow powder. Yield: 20.4 g (90%) Melting point: 89–92° C.

8.3 g of 5% palladium carbon, 83.0 g (0.244 mol) of 2-(3,5-dinitrophenylureido)ethyl isobutyrate (compound 12) and 800 ml of ethanol were placed in a 5-l autoclave The structure of the diamine (compound 13) was confirmed by the infrared absorption (IR) spectrum and proton NMR (H1-NMR) spectrum. The results are shown in Table 2.

(2) Synthesis of Polyimide Precursor

Using the above-obtained 2-(3,5-diaminophenylureido) ethyl isobutyrate (compound 13), a polyamic acid (a polyimide precursor) (compound 10) was synthesized according to the following reaction formula (18).

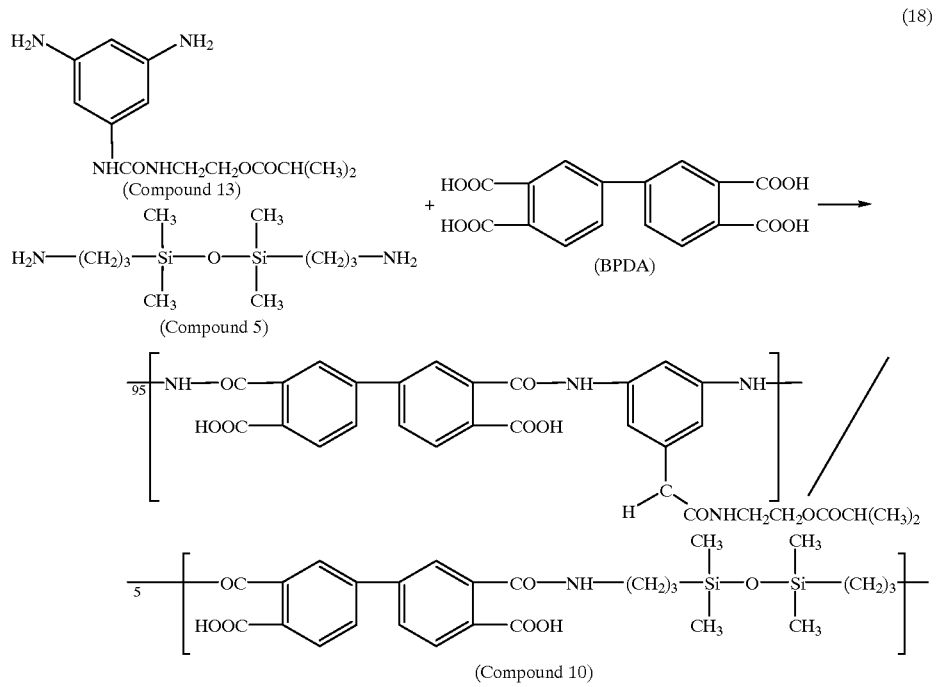

equipped with a thermocouple thermometer and a mixing blade, and the autoclave was sealed. The atmosphere inside the autoclave was replaced by hydrogen and the hydrogen pressure was raised to 5 kg/cm². The autoclave contents were stirred at room temperature (17° C.). Ten minutes later, the autoclave inside temperature rose to 43° C. and the autoclave inside pressure dropped to 1 kg/cm². Then, hydrogen was introduced to raise the pressure to 5 kg/cm², and stirring was continued. Ten minutes later, the temperature became 58° C. and the pressure dropped to 1 kg/cm². Hydrogen was again introduced to raise the pressure to 5 kg/cm², and stirring was continued. Since the temperature began to drop and the pressure became constant (4.5 kg/cm²), stirring was continued for 60 minutes (the temperature dropped to 26° C.). The atmosphere inside the autoclave was replaced by nitrogen, and the autoclave contents were taken out and filtered to remove palladium carbon. The filtrate was concentrated by the use of an evaporator, whereby a solid was separated. The solid was recrystallized from 300 ml of butanol to obtain 2-(3,5-diaminophenylureido)ethyl isobutyrate (compound 13). Yield: 55.0 g (81%) Melting point: 89–90° C.

34.38 g of NMP dehydrated and dried with calcium hydride was placed as a solvent in a 100-ml four-necked flask equipped with a thermometer and a mixing blade (motor-driven). Thereto were added 5.476 g (0.0185 mol) of the diamine (compound 13) and 0.2425 g (0.000976 mol) of bis(3-aminopropyl)tetramethyldisiloxane (compound 5), followed by stirring for dissolution. To the resulting solution was added, in small portions, 5.742 g (0.0195 mol) of powdery BPDA. During the addition, the liquid temperature rose to 35° C.; one hour later, the temperature dropped to room temperature; 2 hours later, BPDA dissolved completely. Then, stirring was conducted at room temperature for 4 hours and the viscosity of the solution became 3.10 Pa·s. The solution (solid content=25%) was filtered under pressure through a filter having pores of 5 μm to obtain an intended polyamic acid (compound 10).

SYNTHESIS EXAMPLES 4–7

There were synthesized four different polyimide precursors (hereinafter referred to as compounds 14, 15, 16 and 17) having recurring unit constitutions represented by the following chemical formulas (19), (20), (21) and (22), respectively.

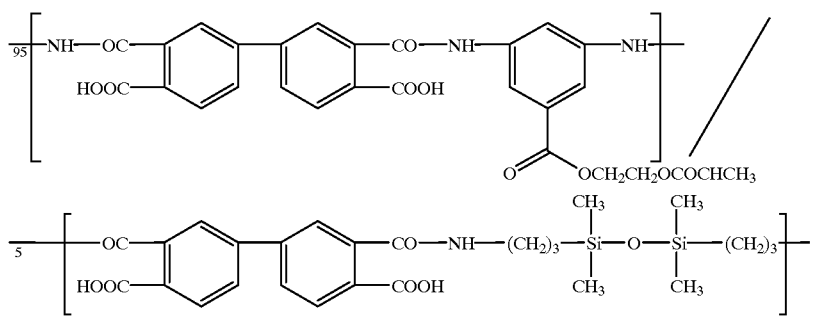

(19)

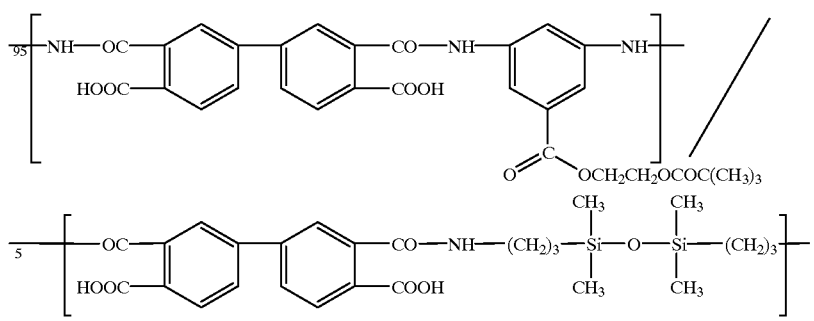

(20)

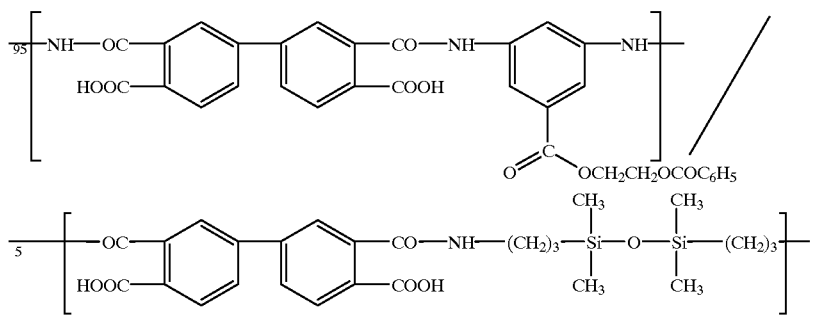

(21)

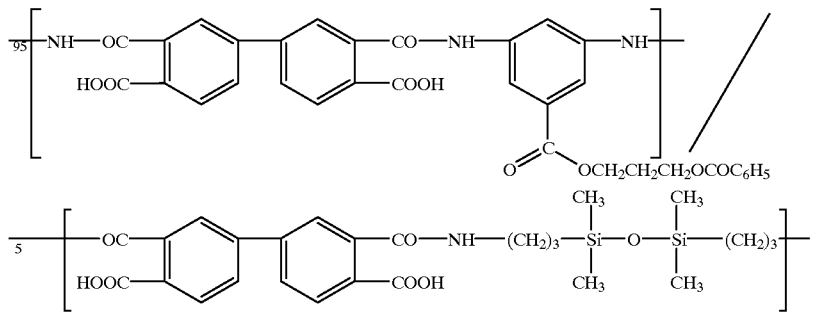

(22)

(1) Synthesis of Diamine Compounds

By using a compound 2 and an appropriately selected ester and by employing the same procedure as used for the synthesis of compound 4 in Synthesis Example 1, there were synthesized 2-(3,5-diaminobenzoyloxy)ethyl acetate (compound 17), 2-(3,5-diaminobenzoyloxy)ethyl t-butyrate (compound 18), 2-(3,5-diaminobenzoyloxy)ethyl benzoate (compound 19) and 2-(3,5-diaminobenzoyloxy)propyl benzoate (compound 20). The yield of compound 17 was 72% (yield of dinitro substance: 83%, yield of diamine: 87%); the yield of compound 18 was 68% (yield of dinitro substance: 82%, yield of diamine: 83%); and the yield of compound 19 was 73% (yield of dinitro substance: 86%, yield of diamine: 85%). The synthesis reactions for compounds 17–20 are shown in the following reaction schemes (23) and (24). The reaction scheme (23)(a) is for compound 17; the reaction scheme (23)(b) is for compound 18; the reaction scheme (24)(a) is for compound 19; and the reaction scheme (24)(b) is for compound 20.

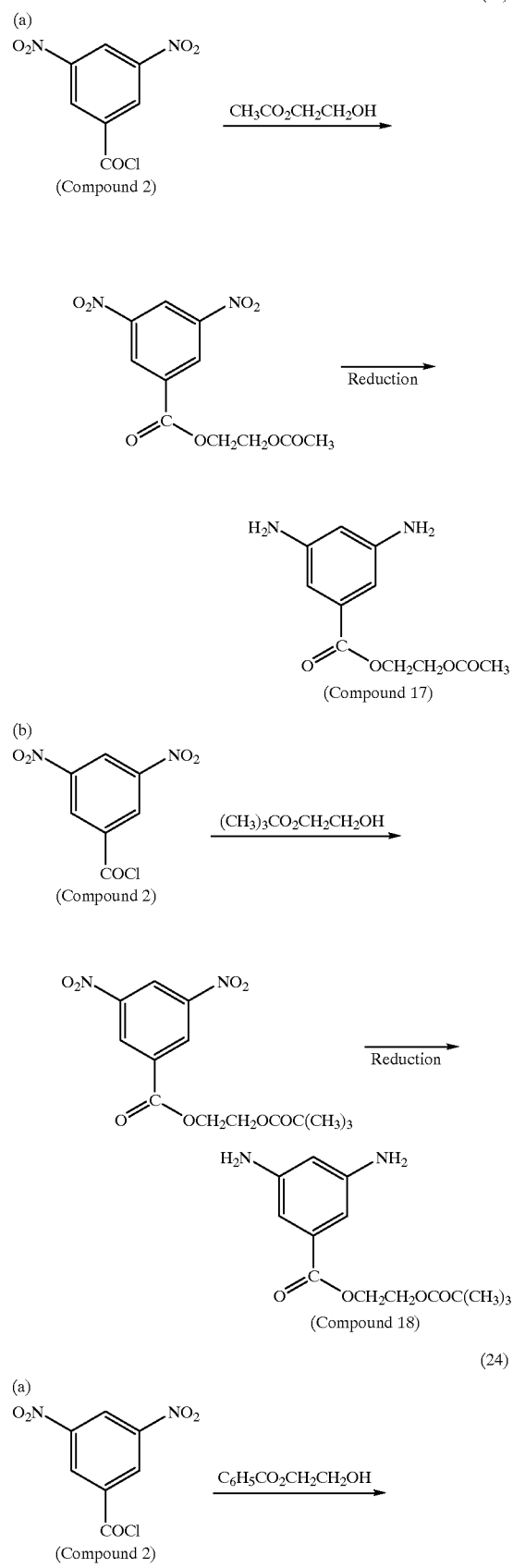

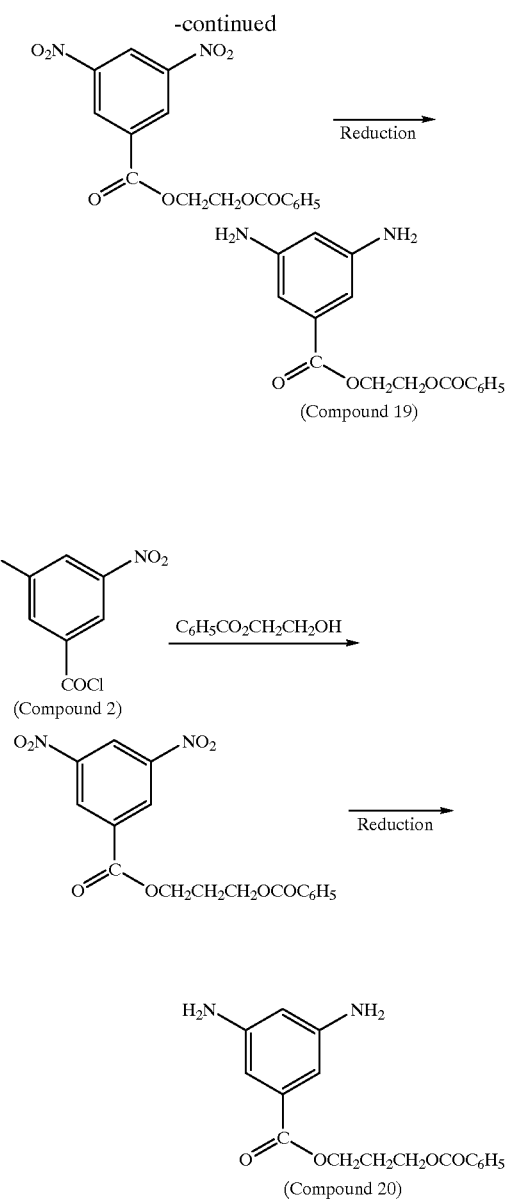

The structures of compounds 17–20 were confirmed by the infrared absorption spectrum and proton NMR spectrum. The results are shown in Table 1.

(2) Synthesis of Polyimide Precursors

Each of the above-obtained diamines (compounds 17–20) was copolymerized with a compound 5 and biphenyltetracarboxylic acid dianhydride (BPDA) to synthesize polyamic acids (polyimide precursors) (compounds 14, 15, 16-1 and 16-2). The synthesis methods were the same as used for the synthesis of compound 1 (polyimide precursor) in Synthesis Example 1. The above syntheses were conducted according to the following reaction formulas (25) to (28). The reaction formula (25) is for compound 14; the reaction formula (26) is for compound 15; the reaction formula (27) is for compound 16; and the reaction formula (28) is for compound 17.

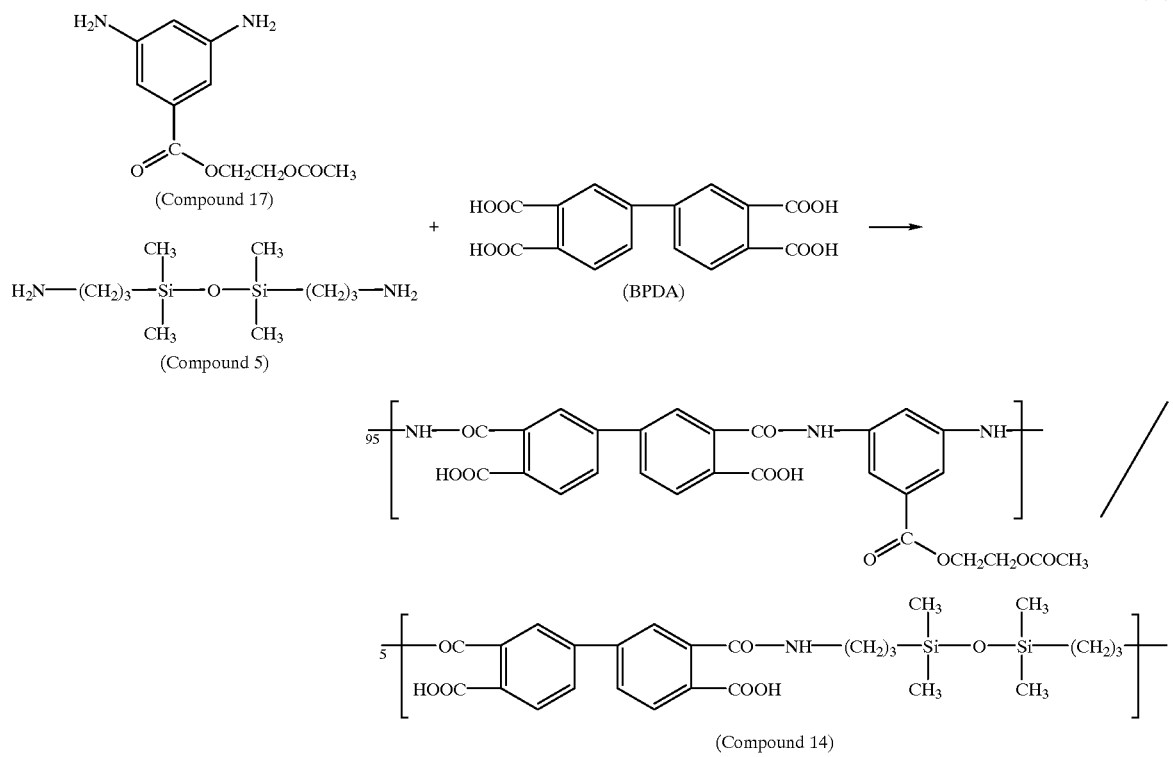
(25)
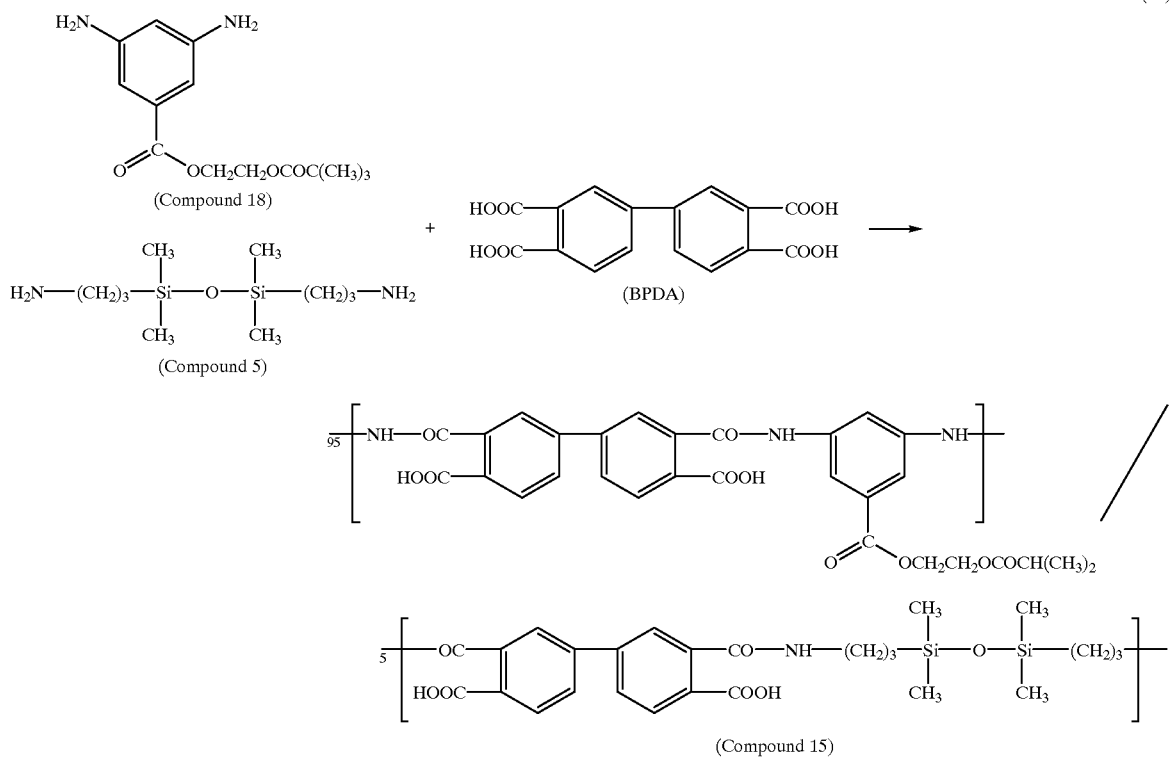
(26)

(27)
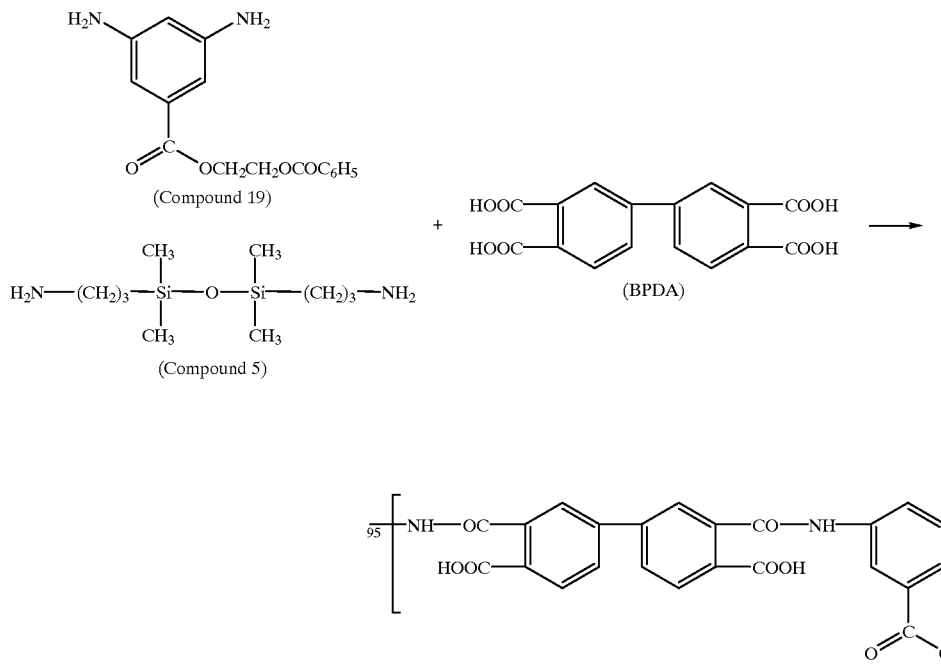
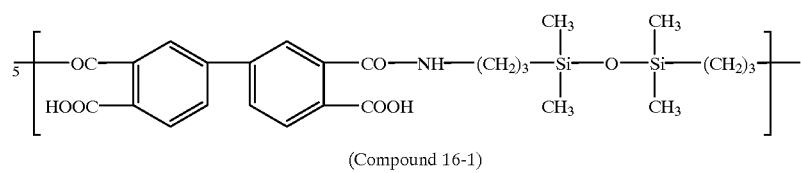
(28)
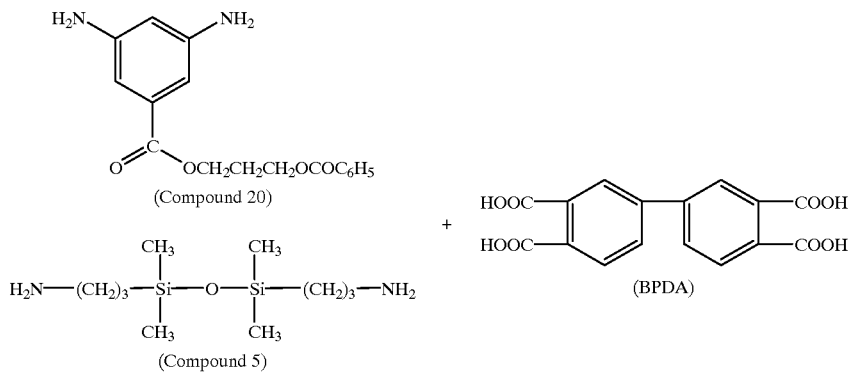

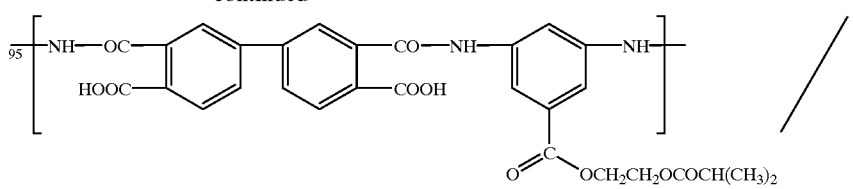

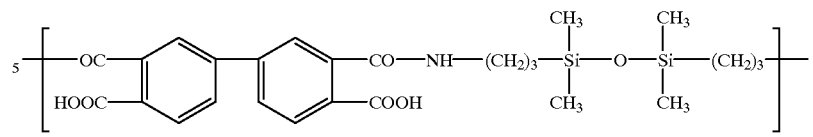

(Compound 16-2)

SYNTHESIS EXAMPLES 8–21

Using diamine compounds synthesized in the same manners as in Synthesis Examples 1–7, there were synthesized various polyimide precursors (compounds 21–34) in the same manner as in the synthesis of the polyimide precursor (compound 1) of Synthesis Example 1. The raw materials and their molar ratios used in Synthesis examples 8–21 are shown in Table 3.

TABLE 3

Raw materials and products of Synthesis Examples 8–21

| No. of Synthesis Examples | Diamine monomers (molar ratio) | | | Acid dianhydride monomer (molar ratio) | Product |
|---|---|---|---|---|---|
| 8 | Compound 4 (50) | Compound 5 (5) | m-Phenylene-diamine (45) | BPDA (100) | Compound 21 |
| 9 | Compound 4 (5) | Compound 5 (5) | m-Phenylene-diamine (90) | BPDA (100) | Compound 22 |
| 10 | Compound 9 (50) | Compound 5 (5) | m-Phenylene-diamine (45) | BPDA (100) | Compound 23 |
| 11 | Compound 9 (5) | Compound 5 (5) | m-Phenylene-diamine (90) | BPDA (100) | Compound 24 |
| 12 | Compound 13 (50) | Compound 5 (5) | m-Phenylene-diamine (45) | BPDA (100) | Compound 25 |
| 13 | Compound 13 (5) | Compound 5 (5) | m-Phenylene-diamine (90) | BPDA (100) | Compound 26 |
| 14 | Compound 17 (50) | Compound 5 (5) | m-Phenylene-diamine (45) | BPDA (100) | Compound 27 |
| 15 | Compound 17 (5) | Compound 5 (5) | m-Phenylene-diamine (90) | BPDA (100) | Compound 28 |
| 16 | Compound 18 (50) | Compound 5 (5) | m-Phenylene-diamine (45) | BPDA (100) | Compound 29 |
| 17 | Compound 18 (5) | Compound 5 (5) | m-Phenylene-diamine (90) | BPDA (100) | Compound 30 |
| 18 | Compound 19 (50) | Compound 5 (5) | m-Phenylene-diamine (45) | BPDA (100) | Compound 31 |
| 19 | Compound 19 (5) | Compound 5 (5) | m-Phenylene-diamine (90) | BPDA (100) | Compound 32 |
| 20 | Compound 20 (50) | Compound 5 (5) | m-Phenylene-diamine (45) | BPDA (100) | Compound 33 |
| 21 | Compound 20 (5) | Compound 5 (5) | m-Phenylene-diamine (90) | BPDA (100) | Compound 34 |

In Table 3, compound 21 is a polyimide precursor having a recurring unit constitution represented by the following structural formula (29).

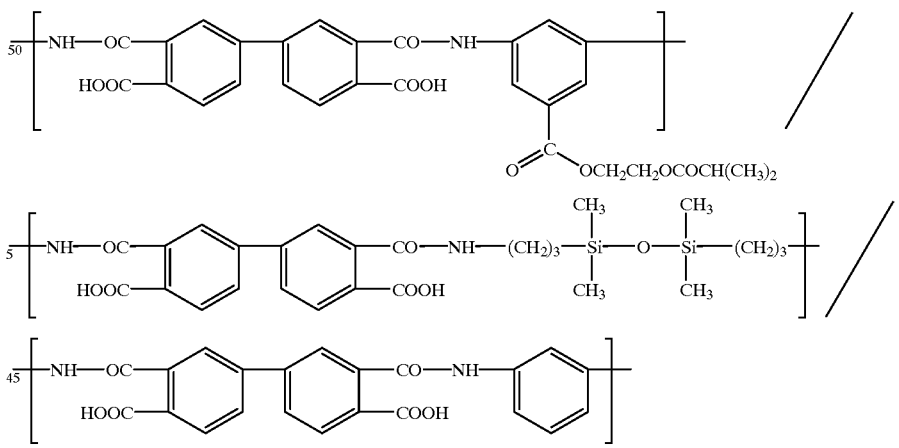
Compound 22 is a polyimide precursor having a recurring unit constitution represented by the following structural formula (30).
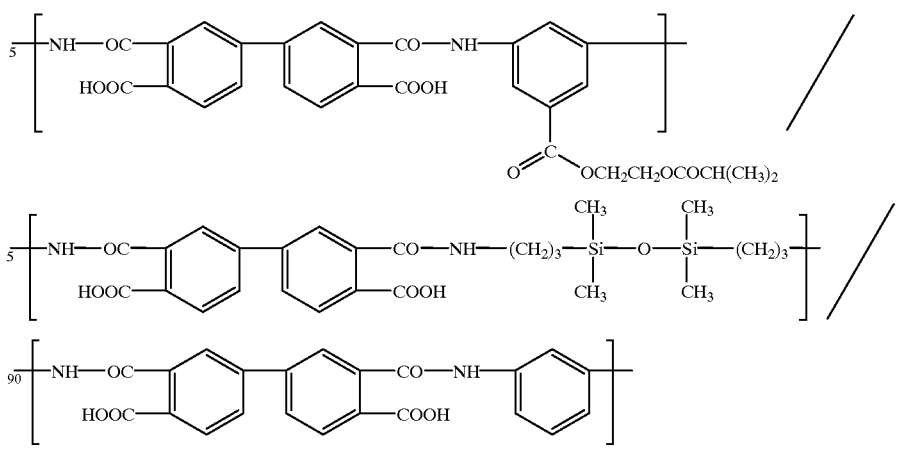
Compound 23 is a polyimide precursor having a recurring unit constitution represented by the following structural formula (31).
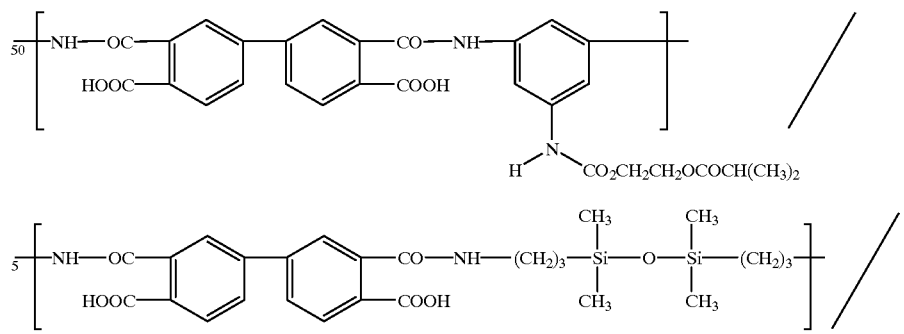

-continued

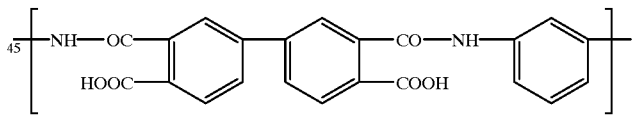

Compound 24 is a polyimide precursor having a recurring unit constitution represented by the following structural formula (32).

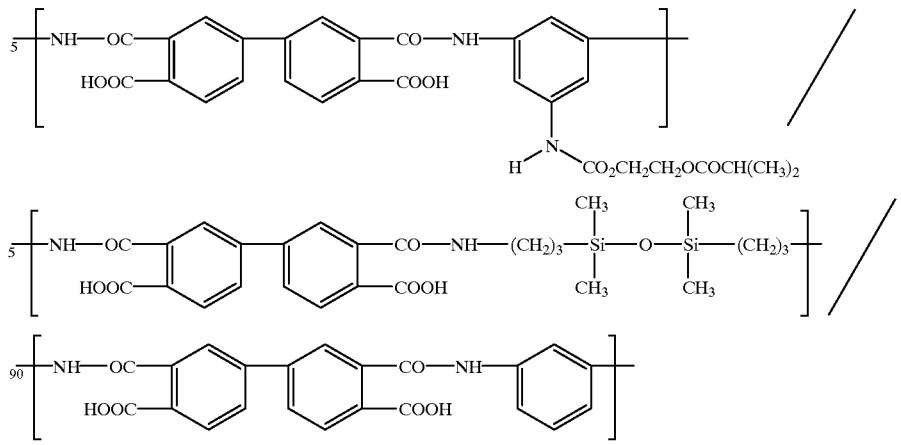

Compound 25 is a polyimide precursor having a recurring unit constitution represented by the following structural formula (33).

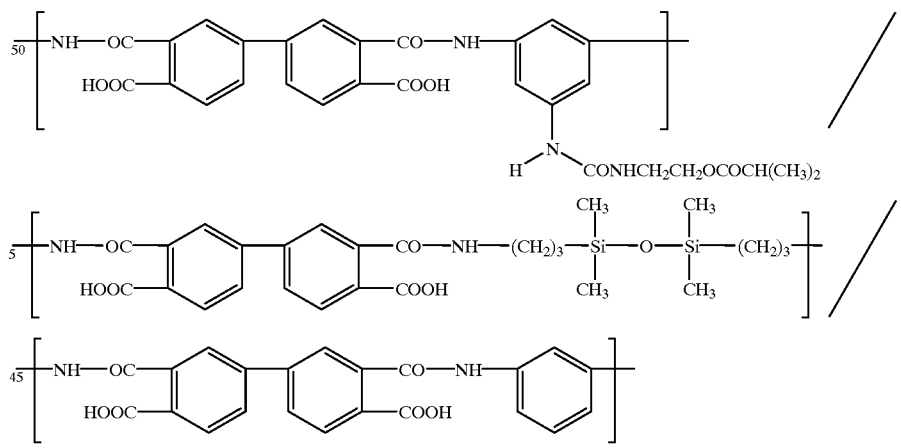

Compound 26 is a polyimide precursor having a recurring unit constitution represented by the following structural formula (34).

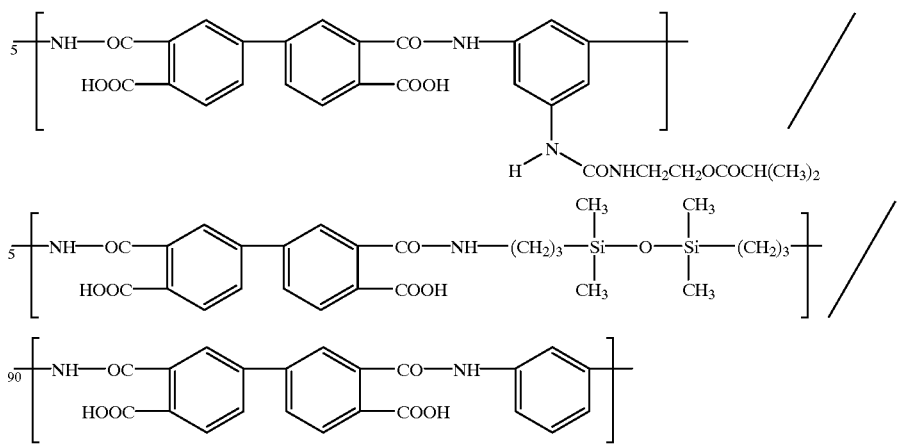
(34)
Compound 27 is a polyimide precursor having a recurring unit constitution represented by the following structural formula (35).
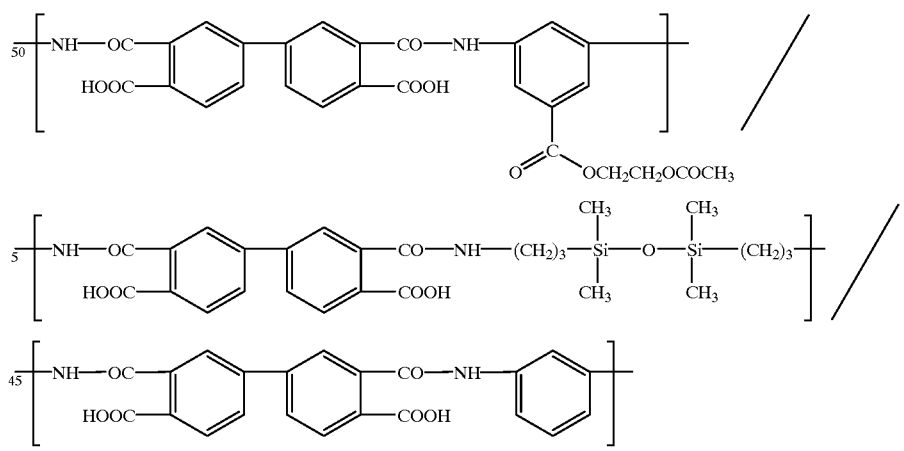
(35)
Compound 28 is a polyimide precursor having a recurring unit constitution represented by the following structural formula (36).
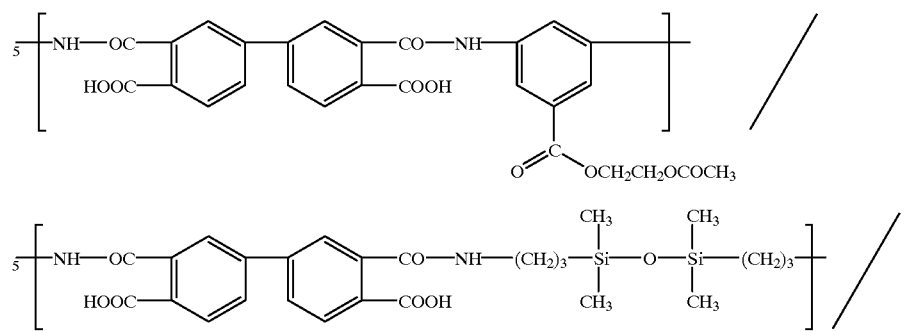
(36)

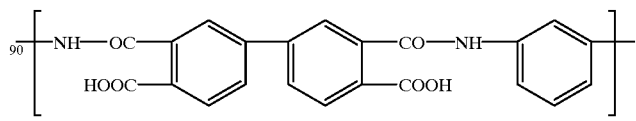

-continued

Compound 29 is a polyimide precursor having a recurring unit constitution represented by the following structural formula (37).

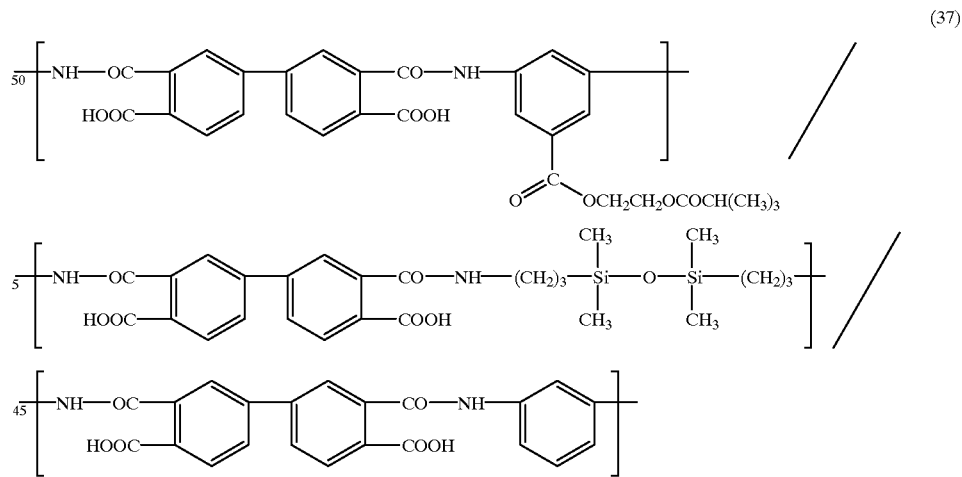

Compound 30 is a polyimide precursor having a recurring unit constitution represented by the following structural formula (38).

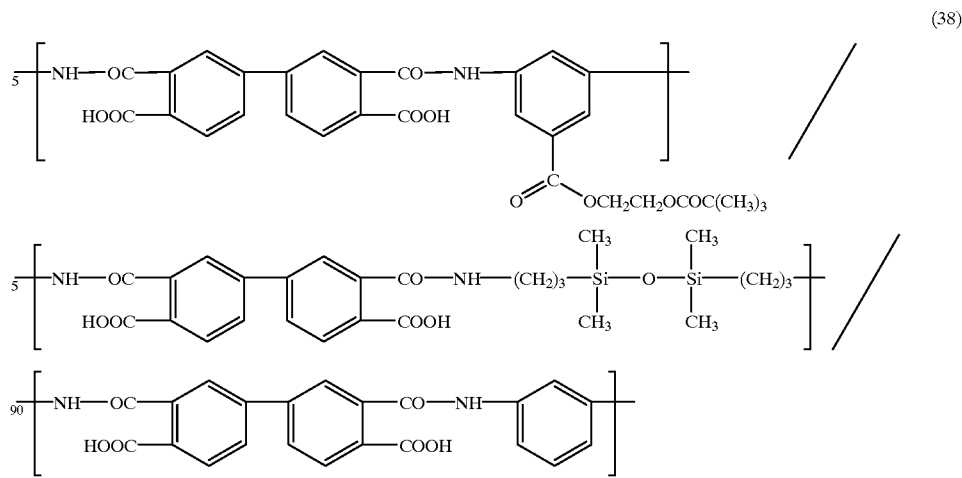

Compound 31 is a polyimide precursor having a recurring unit constitution represented by the following structural formula (39).

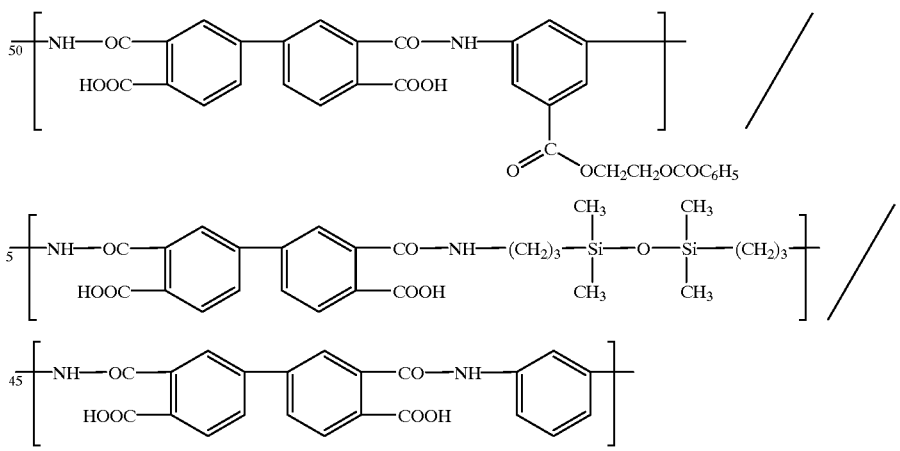
(39)
Compound 32 is a polyimide precursor having a recurring unit constitution represented by the following structural formula (40).
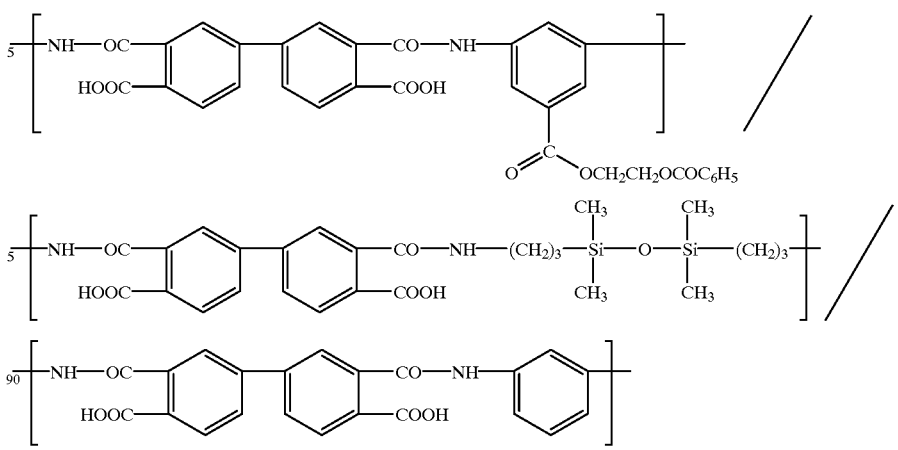
(40)
Compound 33 is a polyimide precursor having a recurring unit constitution represented by the following structural formula (41).
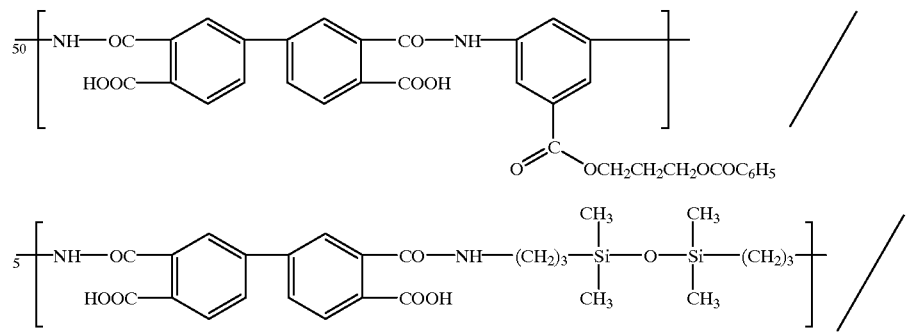
(41)

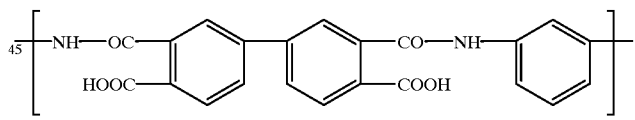

Compound 34 is a polyimide precursor having a recurring unit constitution represented by the following structural formula (42).

(1) Synthesis of Diamine Compound 2-(3,5-diaminophenylureido)ethyl isobutyrate (compound 13) was synthesized in three stages according to the following reaction scheme (44).

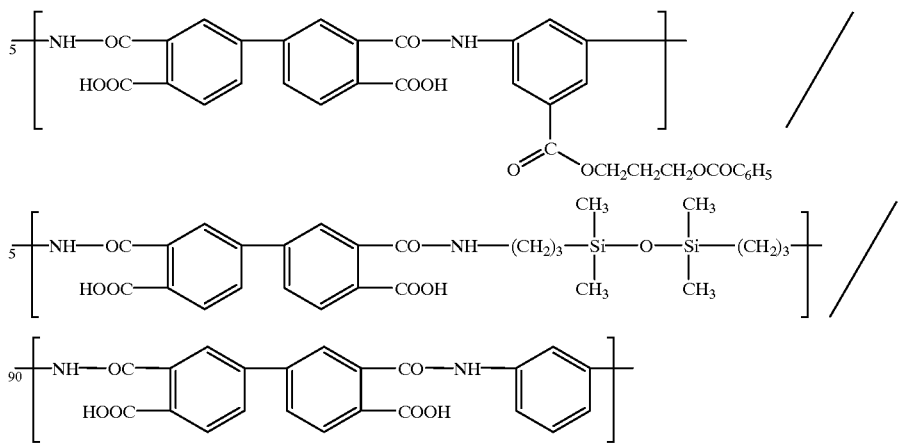

SYNTHESIS EXAMPLE 22

There was synthesized a polyimide precursor having a recurring unit constitution represented by the following chemical formula (43) (said polyimide precursor is hereinafter referred to as compound 35).

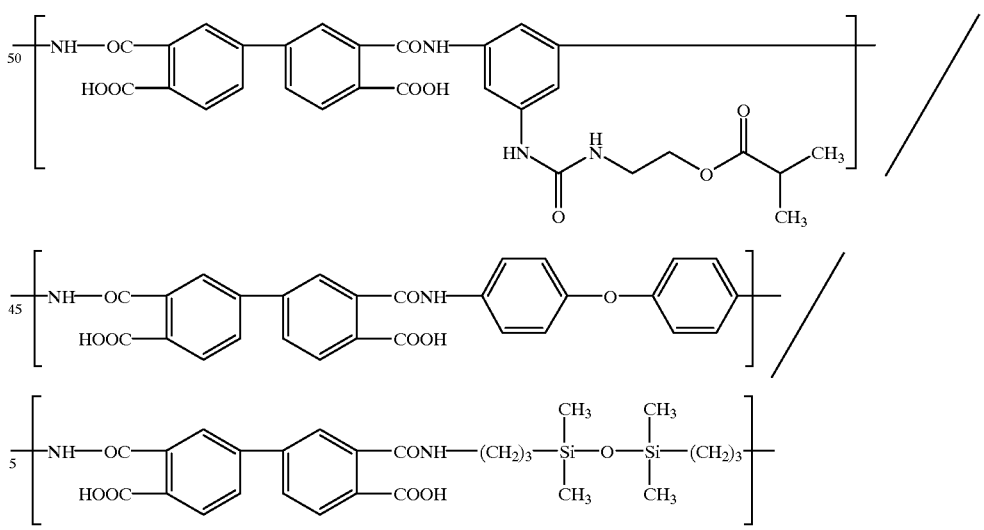

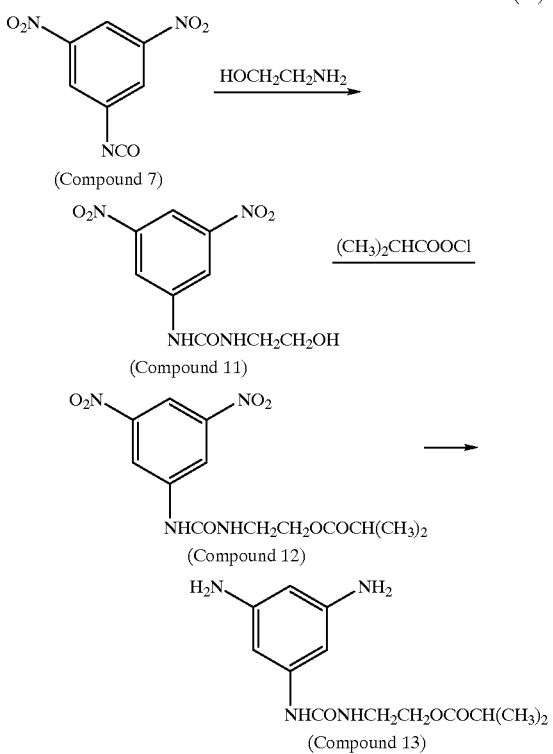

(44)

Acetonitrile was added to 19.5 g (0.0822 mol) of 3,5-dinitrophenyl carbonyl azide in a nitrogen current for dissolution and the total volume was made 50 ml. The resulting solution was heated for refluxing to obtain 50 ml of an acetonitrile solution containing 3,5-dinitrophenyl isocyanate (compound 7).

11.0 g (0.180 mol) of 2-aminoethanol was placed, in a nitrogen current, in a 0.3-l four-necked flask equipped with a nitrogen inlet tube, a dropping funnel, a reflux condenser, a thermometer and a mixing blade. Thereto was added 50 ml of acetonitrile, followed by stirring for dissolution. While the flask was being cooled with ice water, the flask contents were stirred. Thereto was dropwise added 50 ml of the above-obtained acetonitrile solution containing 3,5-dinitrophenyl isocyanate (compound 7). The mixture was stirred at room temperature for 1 hour and then poured into 0.7 l of water. The separated crystals were collected by suction filtration, washed with water and vacuum-dried at 35° C. for 12 hours to obtain N-(3,5-dinitrophenyl)-N-(2-hydroxyethyl)urea (compound 11) as a yellow powder. Yield: 16.7 g (74%) Melting point: 192–194° C.

In a 0.3-l four-necked flask equipped with a dropping funnel, a reflux condenser, a thermometer and a mixing blade were placed 18.0 g (0.0666 mol) of N-(3,5-dinitrophenyl)-N-(2-hydroxyethyl)urea (compound 11) and 5.27 g (0.0666 mol) of pyridine. Thereto was added 150 ml of dichloromethane. The mixture was stirred and became a yellow suspension. While the flask was being cooled with ice water, the flask contents were stirred. Thereto was dropwise added 8.52 g (0.0799 mol) of isobutyryl chloride. After the dropwise addition, the flask was immersed in an oil bath of 40° C. and the flask contents were stirred for 1 hour. Then, the flask contents were cooled to room temperature. Thereto was added 50 ml of water, and the mixture was stirred for several minutes. All the flask contents were transferred into a separating funnel for separation of the aqueous layer. The organic layer taken out was returned to the separating funnel. Thereto was added a 5% aqueous sodium carbonate solution, followed by mixing. The lower layer (organic layer) was taken out and dried over anhydrous magnesium sulfate. From the dried solution was removed dichloromethane by distillation by the use of an evaporator, whereby a solid was separated. The solid was recrystallized from a 2:1 mixed solvent consisting of methanol and water to obtain 2-(3,5-dinitrophenylureido)ethyl isobutyrate (compound 12) as a yellow powder. Yield: 20.4 g (90%) Melting point: 89–92° C.

8.3 g of 5% palladium carbon, 83.0 g (0.244 mol) of 2-(3,5-dinitrophenylureido)ethyl isobutyrate (compound 12) and 800 ml of ethanol were placed in a 5-l autoclave equipped with a thermocouple thermometer and a mixing blade, and the autoclave was sealed. The atmosphere inside the autoclave was replaced by hydrogen and the hydrogen pressure was raised to 5 kg/cm$^2$. The autoclave contents were stirred at room temperature (17° C.). 10 minutes later, the autoclave inside temperature rose to 43° C. and the autoclave inside pressure dropped to 1 kg/cm$^2$. Then, hydrogen was introduced to raise the pressure to 5 kg/cm$^2$, and stirring was continued. 10 minutes later, the temperature became 58° C. and the pressure dropped to 1 kg/cm$^2$. Hydrogen was again introduced to raise the pressure to 5 kg/cm$^2$, and stirring was continued. Since the temperature began to drop and the pressure became constant (4.5 kg/cm$^2$), stirring was continued for 60 minutes (the temperature dropped to 26° C.). The atmosphere inside the autoclave was replaced by nitrogen, and the autoclave contents were taken out and filtered to remove palladium carbon. The filtrate was concentrated by the use of an evaporator, whereby a solid was separated. The solid was recrystallized from 300 ml of butanol to obtain 2-(3,5-diaminophenylureido)ethyl isobutyrate (compound 13). Yield: 55.0 g (81%) Melting point: 89–90° C.

The structure of the diamine (compound 13) was confirmed by the infrared absorption spectrum and proton NMR spectrum. The results are shown in Table 4.

TABLE 4

| Characterization of Compound 13 | |
|---|---|
| Name of compound | 2-(3,5-diaminophenylureido)ethyl isobutyrate |
| Structure | H$_2$N—⌬—NH$_2$ / NHCONHCH$_2$CH$_2$OCOCH(CH$_3$)$_2$ |
| Melting point (° C.) | 89–90 |
| Infrared absorption spectrum cm$^{-1}$ (KBr disc) | 3450 (—NH$_2$), 3300 (—NH$_2$) 1730 (>C=O) |
| Nuclear magnetic resonance spectrum δ(H$^1$-NMR) (Solvent (CD$_3$)$_2$CO) | 1.12(d, 6H, —CH$_3$), 2.5(m, 1H, —CH<), 3.42(br. t, 2H, —CH$_2$—), 4.10(t, 2H, —CH$_2$—), 4.18(br. s, 4H, —NH$_2$), 5.66(s, 1H, aromatic), 5.90(s, 1H, —NH—), 6.13(s, 2H, aromatic), 7.52(s, 1H, —NH—) |

(2) Synthesis of Polyimide Precursor

Using 2-(3,5-diaminophenylureido)ethyl isobutyrate (compound 13), a polyamic acid (a polyimide precursor) (compound 35) was synthesized according to the following reaction formula (45).

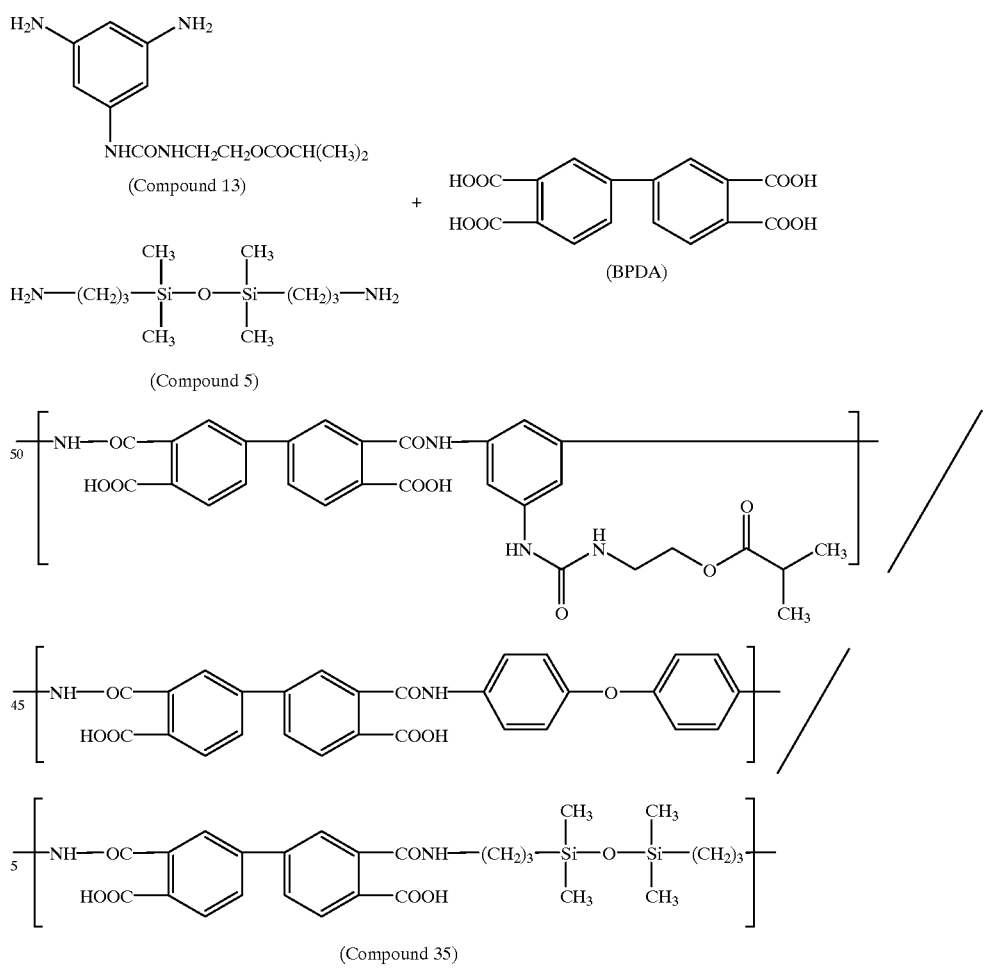

(45)

32.8 g of N-methyl-2-pyrrolidone (hereinafter abbreviated to NMP) dehydrated and dried with calcium hydride was placed as a solvent in a 100-ml four-necked flask equipped with a thermometer and a mixing blade (motor-driven). Thereto were added 5.181 g (0.0185 mol) of N-(3,5-diaminophenyl)-N-(2-isopropoxycarbonylethyl)urea (compound 13) and 0.2425 g (0.000976 mol) of bis(3-aminopropyl)tetramethyldisiloxane (compound 5), followed by stirring for dissolution. To the resulting solution was added, in small portions, 5.742 g (0.0195 mol) of powdery biphenyltetracarboxylic acid dianhydride (BPDA). During the addition, the liquid temperature rose to 35° C.; one hour later, the temperature dropped to room temperature; 2 hours later, BPDA dissolved completely. Then, stirring was conducted at room temperature for 4 hours and the viscosity of the solution became 3.10 Pa·s. The solution (solid content=25%) was filtered under pressure through a filter having pores of 5 μm to obtain an intended polyamic acid (compound 35).

EXAMPLES 1–3 AND COMPARATIVE EXAMPLES 1–2

Various polyimide precursors each composed of 2-(3,5-diaminophenylureido)ethyl isobutyrate (compound 13), bis(3-aminopropyl)tetramethyldisiloxane (compound 5) and m-phenylenediamine were synthesized in the same manner as in Synthesis Example 1 by changing the proportions of these three components, in order to investigate the amount of compound 13 required in polyimide precursor in order for the polyimide formed from said polyimide precursor to show sufficient adhesion to a sealing resin for semiconductor device. As in Synthesis Example 1, these polyimide precursors were each obtained in a polyimide precursor composition of solution form (solid content=25%).

Each polyimide precursor was spin-coated on a silicon wafer in which semiconductor element regions and wiring layers had been formed. The coated composition was dried at 90° C. for 4 minutes and then at 100° C. for 4 minutes to obtain a film having a thickness of 18 μm. Each film was cured at 200° C. for 30 minutes and then at 350° C. for 30 minutes to obtain a polyimide film having a thickness of 10 μm. Each polyimide film was subjected to photoetching using a cyclized polyisoprene-based photoresist and a hydrazine-based etchant for polyimide, to remove the portions of the polyimide film corresponding to the bonding pad areas and to-be-scribed regions of the silicon wafer. Then, the remaining photoresist was removed to obtain each wafer having a polyimide film (a surface-protecting film) at the surface portions other than the bonding pad areas and to-be-scribed regions.

Each wafer obtained above was cut at the to-be-scribed regions to separate individual chips. On the surface of the chip was press-bonded, at 400° C., external terminals supported on a polyimide film having a lower layer of a polyamide imide ether adhesive. Then, the bonding pad areas of the chip and the external terminals were connected with a gold wire by the use of a wire bonder. Thereafter, molding was conducted by the use of a silica-containing epoxy sealant at a temperature of 180° C. at a pressure of 70 kg/cm$^2$ to form a resin-made sealing member. Lastly, the external terminals were bent in a desired shape to obtain a product of DRAM (dynamic random access memory).

Each DRAM was kept for 200 hours in an atmosphere of 85° C. (temperature) and 85% (relative humidity), then heated at 260° C. for 10 seconds (solder reflowing conditions), and subjected to ultrasonic search to examine the occurrence or non-occurrence of peeling. Peeling seen on whole surface was rated as "whole-surface peeling"; partial peeling at one or more of four corners was rated as "partial peeling"; and no peeling was rated as "no peeling". In order to examine the heat resistance of polyimide, a polyimide film having a thickness of 10 μm was prepared separately and measured for weight decrease-starting temperature. Incidentally, weight decrease-starting temperature was rated as "good" when the temperature was 380° C. or more, because a polyimide film having a weight decrease-starting temperature of 380° C. or more can be put into practical application. The proportions of raw materials and evaluation results of products in each Example and Comparative Example are shown in Table 5.

compound 13 must be used, in copolymerization, in an amount of 5 mole % or more based on the total amount of diamines.

EXAMPLES 4–6 AND COMPARATIVE EXAMPLES 3–4

Next, investigation was made on a case using 2-(3,5-diaminophenylcarbamoyloxy)ethyl isobutyrate (compound 9) as a diamine monomer. In Examples 4–6 and Comparative Examples 3–4, 2-(3,5-diaminophenylcarbamoyloxy) ethyl isobutyrate (compound 9) was used in place of the 2-(3,5-diaminophenylureido)ethyl isobutyrate (compound 13) used in Examples 1–3 and Comparative Examples 1–2; and peeling and heat resistance were evaluated in the same manner as in Examples 1–3 nd Comparative Examples 1–2. The proportions of raw materials and evaluation results of products in each Example and Comparative Example are shown in Table 6.

TABLE 5

Compositions of polyamic acids and evaluations of polyimides produced therefrom

| | Diamine monomers (molar ratio) | | | Acid dianhydride (molar ratio) | Peeling resistance | Heat resistance |
|---|---|---|---|---|---|---|
| Example 1 | 2-(3,5-diaminophenylureido)ethyl isobutyrate (40) | m-Phenylenediamine (55) | Bis(3-aminopropyl)-tetramethyl-disiloxane (5) | 3,3',4,4'-Biphenyl-tetracarboxylic acid dianhydride (100) | No peeling | Good |
| Example 2 | 2-(3,5-diaminophenylureido)ethyl isobutyrate (20) | m-Phenylenediamine (75) | Bis(3-aminopropyl)-tetramethyl-disiloxane (5) | 3,3',4,4'-Biphenyl-tetracarboxylic acid dianhydride (100) | No peeling | Good |
| Example 3 | 2-(3,5-diaminophenylureido)ethyl isobutyrate (5) | m-Phenylenediamine (90) | Bis(3-aminopropyl)-tetramethyl-disiloxane (5) | 3,3',4,4'-Biphenyl-tetracarboxylic acid dianhydride (100) | No peeling | Good |
| Comparative Example 1 | 2-(3,5-diaminophenylureido)ethyl isobutyrate (3) | m-Phenylenediamine (92) | Bis(3-aminopropyl)-tetramethyl-disiloxane (5) | 3,3',4,4'-Biphenyl-tetracarboxylic acid dianhydride (100) | Partial peeling | Good |
| Comparative Example 2 | 2-(3,5-diaminophenylureido)ethyl isobutyrate (0) | m-Phenylenediamine (95) | Bis(3-aminopropyl)-tetramethyl-disiloxane (5) | 3,3',4,4'-Biphenyl-tetracarboxylic acid dianhydride (100) | Whole-surface peeling | Good |

As is clear from the results shown in Table5, compound 13 was certainly effective for adhesion between polyimide film and molding resin. Good heat resistance was obtained in all cases. However, in order to obtain good adhesion,

TABLE 6

Compositions of polyamic acids and evaluations of polyimides produced therefrom

| | Diamine monomers (molar ratio) | | | Acid dianhydride (molar ratio) | Peeling resistance | Heat resistance |
|---|---|---|---|---|---|---|
| Example 4 | 2-(3,5-diamino-phenyl-carbamoyloxy) ethyl isobutyrate (40) | m-Phenylene-diamine (55) | Bis(3-amino-propyl)-tetramethyl-disiloxane (5) | 3,3',4,4'-Biphenyl-tetracarboxylic acid dianhydride (100) | No peeling | Good |
| Example 5 | 2-(3,5-diamino-phenyl-carbamoyloxy) ethyl isobutyrate (20) | m-Phenylene-diamine (75) | Bis(3-amino-propyl)-tetramethyl-disiloxane (5) | 3,3',4,4'-Biphenyl-tetracarboxylic acid dianhydride (100) | No peeling | Good |
| Example 6 | 2-(3,5-diamino-phenyl-carbamoyloxy) ethyl isobutyrate (5) | m-Phenylene-diamine (90) | Bis(3-amino-propyl)-tetramethyl-disiloxane (5) | 3,3',4,4'-Biphenyl-tetracarboxylic acid dianhydride (100) | No peeling | Good |
| Comparative Example 3 | 2-(3,5-diamino-phenyl-carbamoyloxy) ethyl isobutyrate (3) | m-Phenylene-diamine (92) | Bis(3-amino-propyl)-tetramethyl-disiloxane (5) | 3,3',4,4'-Biphenyl-tetracarboxylic acid dianhydride (100) | Partial peeling | Good |
| Comparative Example 4 | 2-(3,5-diamino-phenyl-carbamoyloxy) ethyl isobutyrate (0) | m-Phenylene-diamine (95) | Bis(3-amino-propyl)-tetramethyl-disiloxane (5) | 3,3',4,4'-Biphenyl-tetracarboxylic acid dianhydride (100) | Whole-surface peeling | Good |

As is clear from the results shown in Table 6, compound 9 was certainly effective for adhesion between polyimide film and molding resin. Good heat resistance was obtained in all cases. However, in order to obtain good adhesion, compound 9 must be used, in copolymerization, in an amount of 5 mole % or more based on the total amount of diamines.

EXAMPLE 7

Using compound 1 [a polyimide precursor having a recurring unit constitution represented by chemical formula (10)], a semiconductor device shown in FIG. 1 (a DRAM in the present Example) was produced and examined for the adhesion between the surface-protecting film 2 of the semiconductor element 1 and the sealing member 6 of the device.

(1) Production of Semiconductor Device

A polyimide precursor composition, which was an Nmethyl-2-pyrrolidone solution (solid content=25% by weight) of compound 1 [a polyimide precursor having a recurring unit constitution represented by chemical formula (10)] synthesized in Synthesis Example 1, was spin-coated on a silicon wafer in which semiconductor element regions and wiring layers had been formed. The coated composition was dried at 90° C. for 4 minutes and then at 100° C. for 4 minutes by the use of a hot place to obtain a polyimide precursor film having a thickness of 18 μm. The film was cured at 200° C. for 30 minutes and then at 350° C. for 30 minutes to obtain a polyimide film having a thickness of 10 μm.

The portions of the polyimide film corresponding to the bonding pad areas and to-be-scribed regions of the silicon wafer were removed by photoetching using a cyclized polyisoprene-based photoresist and a hydrazine-based etchant for polyimide. Then, the remaining photoresist was removed to obtain a surface-protecting film made of a polyimide.

Thus, a silicon wafer 9 having a surface-protecting film 2, shown in FIG. 2A was obtained. In this silicon wafer 9, the bonding pad areas 7 and the to-be-scribed regions 8 are exposed. The silicon wafer 9 was cut at the to-be-scribed regions 8 to obtain a semiconductor element 1 having a surface-protecting film 2, shown in FIG. 2B.

Then, as shown in FIG. 2C, there was prepared an adhesive member 4 made of a polyimide film having a polyamide imide ether layer on either of the front or back side. External terminals (lead frames) 3 were provided on the side of the adhesive member 4 having no polyamide imide ether layer; the semiconductor element 1 was provided on the side of the adhesive member 4 having a polyamide imide ether layer so that the surface-protecting film 2 and the polyamide imide ether layer faced each other; and they were press-bonded at 400° C.

Thereafter, as shown in FIG. 2D, the bonding pad areas 7 and the external terminals 3 were connected with a gold wire 5 by the use of a wire bonder. As shown in FIG. 2E, molding was conducted with a silica-containing epoxy sealant at a temperature of 180° C. at a pressure of 70 kg/cm² to form a sealing member 6. Lastly, the external terminals 3 were bent in a desired shape to obtain a DRAM product shown in FIG. 2F or FIG. 1.

(2) Evaluation of Peeling Resistance

The DRAM obtained in the present Example has, as a surface-protecting film for semiconductor element, a polyimide film obtained by heat-curing a polyimide precursor composition containing compound 1 (a polyimide precursor).

The DRAM was allowed to stand under the constant-temperature and constant-humidity conditions of 85° C. and 85% for 200 hours; then, heated at 260° C. for 10 seconds (solder reflowing conditions); and subjected to ultrasonic search to examine the occurrence or non-occurrence of peeling. There was no peeling between the surface-protecting film 2 and the sealing member 6, and the DRAM was a highly reliable semiconductor device.

COMPARATIVE EXAMPLE 5

The test results obtained using the technique described in JP-B-63-31939 are shown for comparison.
(1) Preparation of Polyimide Precursor 100 g (0.5 mol) of 4,4'-diaminodiphenyl ether was dissolved, in a nitrogen current, in 1,791 g of a 1:1 mixture of N-methyl-2-pyrrolidone and N,N-dimethylacetamide to prepare an amine solution. The solution was kept at about 15° C. with ice-cooling. Thereto was added 109 g (0.5 mol) of pyromellitic acid dianhydride with stirring. After the addition, a further reaction was allowed to occur for 5 hours at 15° C. Viscosity adjustment was made at 25° C. to obtain a polyamic acid solution having a viscosity of 20 poises at 25° C.
(2) Production of Semiconductor Device The above solution was spin-coated on a silicon wafer in which semiconductor element regions and wiring layers had been formed. The coated solution was dried at 90° C. for 4 minutes and then at 100° C. for 4 minutes by the use of a hot place to obtain a polyimide precursor film having a thickness of 18 μm. The film was cured at 200° C. for 30 minutes and then at 350° C. for 30 minutes to obtain a polyimide film having a thickness of 10 μm. The portions of the polyimide film corresponding to the bonding pad areas and to-be-scribed regions of the silicon wafer were removed in the same manner as in Example 7. The resulting material was subjected to the same procedure as in Example 7 to produce a semiconductor device (a DRAM).
(3) Evaluation of Peeling Resistance The DRAM was evaluated for peeling resistance during solder reflowing. The DRAM was allowed to stand under the constant-temperature and constant-humidity conditions of 85° C. and 85% for 200 hours; then, heated at 260° C. for 10 seconds (solder reflowing conditions); and subjected to ultrasonic search to examine the occurrence or non-occurrence of peeling. There was peeling between the polyimide film and the sealing resin.

EXAMPLES 8–13

Six DRAMs were produced in the same manner as in Example 1 except that the compound 1 used in Example 1 was replaced by compound 6 [a polyimide precursor having a recurring unit constitution represented by chemical formula (13)] synthesized in Synthesis Example 2, in Example 8; compound 10 [a polyimide precursor having a recurring unit constitution represented by chemical formula (16)] synthesized in Synthesis Example 3, in Example 9; compound 14 [a polyimide precursor having a recurring unit constitution represented by chemical formula (19)] synthesized in Synthesis Example 4, in Example 10; compound 15 [a polyimide precursor having a recurring unit constitution represented by chemical formula (20)] synthesized in Synthesis Example 5, in Example 11; compound 16 [a polyimide precursor having a recurring unit constitution represented by chemical formula (21)] synthesized in Synthesis Example 6, in Example 12; and compound 17 [a polyimide precursor having a recurring unit constitution represented by chemical formula (22)] synthesized in Synthesis Example 7, in Example 13.

Each of the DRAMs obtained in the present Examples 8–13 has, as a surface-protecting film for semiconductor element, a polyimide film obtained by heat-curing a polyimide precursor composition containing compound 6, 10, 14, 15, 16 or 17.

Each DRAM was allowed to stand under the constant-temperature and constant-humidity conditions of 85° C. and 85% for 200 hours; then, heated at 260° C. for 10 seconds (solder reflowing conditions); and subjected to ultrasonic search to examine the occurrence or non-occurrence of peeling. In each DRAM, there was no peeling between the surface-protecting film 2 and the sealing member 6, and each DRAM was a highly reliable semiconductor device.

EXAMPLE 14

A semiconductor device was produced using a polyimide precursor composition which contained compound 21 and which further contained a photosensitizer for photosensitivity. The device was examined for peeling resistance.
(1) Production of Semiconductor Device A solution (solid content=25% by weight) of 100 parts by weight of compound 21 [a polyimide precursor having a recurring unit constitution represented by chemical formula (29)] synthesized in Synthesis Example 8, dissolved in a 8:2 mixture of N-methyl-2-pyrrolidone and xylene was mixed with 31.4 parts by weight of 2-(N,N-dimethylamino)ethyl methacrylate, 2.0 parts by weight of Michler's ketone and 2.0 parts by weight of 1,3-diphenyl-1,2,3-propanetrione-2-(o-ethoxycarbonyl) oxime, whereby a polyimide precursor composition was obtained. The composition was spin-coated on a silicon wafer in which semiconductor element regions and wiring layers had been formed. The coated composition was dried at 90° C. for 4 minutes and then at 100° C. for 4 minutes by the use of a hot plate to obtain a photosensitive film having a thickness of 18 μm.

The film was irradiated with ultraviolet rays for 20 seconds through a given photomask by the use of an i-line stepper. The irradiated film was subjected to development with a developer consisting of 4 volumes of N-methyl-2-pyrrolidone and 1 volume of water, followed by rinsing with isopropyl alcohol, whereby the non-irradiated portions of the photosensitive film corresponding to the bonding pad areas and to-be-scribed regions of the silicon wafer were removed to obtain a polyimide precursor film of desired pattern. The film was cured at 200° C. for 30 minutes and then at 350° C. for 30 minutes to obtain a surface-protecting film of desired pattern, made of a polyimide. The film had a thickness of 10 μm.

The thus-obtained silicon wafer having a surface-protecting film was cut at the to-be-scribed regions to obtain a semiconductor element having a surface-protecting film. To this semiconductor element was adhered external terminals via an adhesive member; the bonding pad areas of the semiconductor element and the external terminals were connected with a gold wire; molding was conducted with a silica-containing epoxy sealant at a temperature of 180° C. at a pressure of 70 kg/cm$^2$; and the external terminals were bent in a desired shape to obtain a DRAM product.
(2) Evaluation of Peeling Resistance The DRAM obtained in the present Example has, as a surface-protecting film for semiconductor element, a polyimide film formed by heat-curing a polyimide precursor composition containing 100 parts by weight of compound 21, 31.4 parts by weight of 2-(N,N-dimethylamino)ethyl methacrylate (an amine compound having a carbon-to-carbon double bond), 2.0 parts by weight of Michler's ketone (a photosensitizing agent) and 2.0 parts by weight of 1,3-diphenyl-1,2,3-propanetrione-2-(o-ethoxycarbonyl) oxime (a photosensitizing aid).

The DRAM was allowed to stand under the constant-temperature and constant-humidity conditions of 85° C. and 85% for 200 hours; then, heated at 260° C. for 10 seconds (solder reflowing conditions); and subjected to ultrasonic search to examine the occurrence or non-occurrence of peeling. There was no peeling between the surface-protecting film 2 and the sealing member 6, and the DRAM was a highly reliable semiconductor device.

EXAMPLES 15–20

Six DRAMs were produced in the same manner as in Example 14 except that the compound 21 used in Example 14 was replaced by compound 22 [a polyimide precursor having a recurring unit constitution represented by chemical formula (30)] synthesized in Synthesis Example 9, in Example 15; compound 23 [a polyimide precursor having a recurring unit constitution represented by chemical formula (31)] synthesized in Synthesis Example 10, in Example 16; compound 24 [a polyimide precursor having a recurring unit constitution represented by chemical formula (32)] synthesized in Synthesis Example 11, in Example 17; compound 25 [a polyimide precursor having a recurring unit constitution represented by chemical formula (33)] synthesized in Synthesis Example 12, in Example 18; compound 26 [a polyimide precursor having a recurring unit constitution represented by chemical formula (34)] synthesized in Synthesis Example 13, in Example 19; and compound 27 [a polyimide precursor having a recurring unit constitution represented by chemical formula (35)] synthesized in Synthesis Example 14, in Example 20.

Each of the DRAMs obtained in the present Examples 15–20 has, as a surface-protecting film for semiconductor element, a polyimide film obtained by heat-curing a polyimide precursor composition containing compound 22, 23, 24, 25, 26 or 27, an amine compound having a carbon-to-carbon double bond, a photosensitizing agent and a photosensitizing aid.

Each DRAM was allowed to stand under the constant-temperature and constant-humidity conditions of 85° C. and 85% for 200 hours; then, heated at 260° C. for 10 seconds (solder reflowing conditions); and subjected to ultrasonic search to examine the occurrence or non-occurrence of peeling. In each DRAM, there was no peeling between the surface-protecting film and the sealing member, and each DRAM was a highly reliable semiconductor device.

EXAMPLE 21

A solution (solid content=25% by weight) of 100 parts by weight of compound 28 [a polyimide precursor having a recurring unit constitution represented by chemical formula (36)] synthesized in Synthesis Example 15, dissolved in a 8:2 mixture of N-methyl-2-pyrrolidone and xylene was mixed with 31.4 parts by weight of 2-(N,N-dimethylamino) ethyl methacrylate and 7.2 parts by weight of 2,6-di(4'-azidobenzal)-hydroxycyclohexanone, whereby a polyimide precursor composition was obtained. Using this composition, a DRAM was produced in the same manner as in Example 14.

The DRAM obtained in the present Example has, as a surface-protecting film for semiconductor element, a poly imide film formed by heat-curing a polyimide precursor composition containing 100 parts by weight of compound 28, 31.4 parts by weight of 2-(N,N-dimethylamino)ethyl methacrylate (an amine compound having a carbon-to-carbon double bond) and 7.2 parts by weight of 2,6-di(4'-azidobenzal)-hydroxycyclohexanone (a photosensitizing agent).

The DRAM was allowed to stand under the constant-temperature and constant-humidity conditions of 85° C. and 85% for 200 hours; then, heated at 260° C. for 10 seconds (solder reflowing conditions); and subjected to ultrasonic search to examine the occurrence or non-occurrence of peeling. There was no peeling between the surface-protecting film and the sealing member, and the DRAM was a highly reliable semiconductor device.

EXAMPLES 22–27

Six DRAMs were produced in the same manner as in Example 21 except that the compound 28 used in Example 21 was replaced by compound 29 [a polyimide precursor having a recurring unit constitution represented by chemical formula (37)] synthesized in Synthesis Example 16, in Example 22; compound 30 [a polyimide precursor having a recurring unit constitution represented by chemical formula (38)] synthesized in Synthesis Example 17, in Example 23; compound 31 [a polyimide precursor having a recurring unit constitution represented by chemical formula (39)] synthesized in Synthesis Example 18, in Example 24; compound 32 [a polyimide precursor having a recurring unit constitution represented by chemical formula (40)] synthesized in Synthesis Example 19, in Example 25; compound 33 [a polyimide precursor having a recurring unit constitution represented by chemical formula (41)] synthesized in Synthesis Example 20, in Example 26; and compound 34 [a polyimide precursor having a recurring unit constitution represented by chemical formula (42)] synthesized in Synthesis Example 21, in Example 27.

Each of the DRAMs obtained in the present Examples 22–27 has, as a surface-protecting film for semiconductor element, a polyimide film obtained by heat-curing a polyimide precursor composition containing compound 28, 29, 30, 31, 32 or 33, an amine compound having a carbon-to-carbon double bond and a photosensitizing agent.

Each DRAM was allowed to stand under the constant-temperature and constant-humidity conditions of 85° C. and 85% for 200 hours; then, heated at 260° C. for 10 seconds (solder reflowing conditions); and subjected to ultrasonic search to examine the occurrence or non-occurrence of peeling. In each DRAM, there was no peeling between the surface-protecting film and the sealing member, and each DRAM was a highly reliable semiconductor device.

EXAMPLE 28

A polyimide precursor was obtained as a polyimide precursor composition of solution form (solid content=25% by weight) containing a polyimide precursor represented by chemical formula (43), in the same manner as in Synthesis Example 22.

(43)

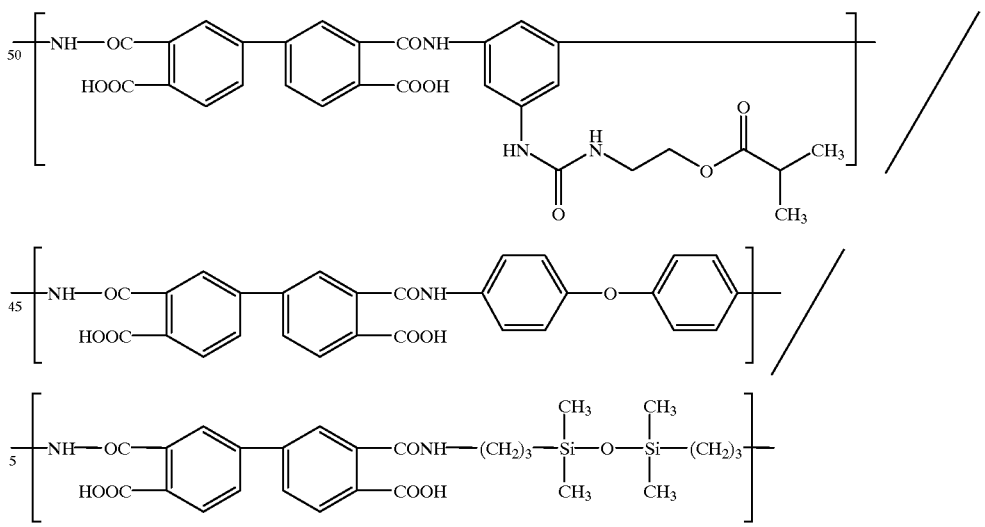

The polyimide precursor composition (solution) was spin-coated on a silicon wafer in which semiconductor element regions and wiring layers had been formed. The coated composition was dried at 90° C. for 4 minutes and then at 100° C. for 4 minutes to obtain a film having a thickness of 18 μm. The film was cured at 200° C. for 30 minutes and then at 350° C. for 30 minutes to obtain a polyimide film having a thickness of 10 μm. The polyimide film was subjected to photoetching using a cyclized polyisoprene-based photoresist and a hydrazine-based etchant for polyimide, to remove the portions of the polyimide film corresponding to the bonding pad areas and to-be-scribed regions of the silicon wafer. Then, the remaining photoresist was removed to obtain a wafer having a polyimide film (a surface-protecting film) at the surface portions other than the bonding pad areas and to-be-scribed regions. The wafer obtained above was cut at the to-be-scribed regions to separate individual chips.

There was prepared, as an adhesive member, a polyamide film having a polyamide imide ether layer (an adhesive) on one side. On the side of the adhesive member having no polyamide imide ether layer were provided external terminals; on the side of the adhesive member having a polyamide imide ether layer was provided the above-obtained chip so that the polyamide imide ether layer and the surface-protecting film of the chip faced each other; and they were press-bonded at 400° C. Then, the bonding pad areas of the chip and the external terminals were connected with a gold wire by the use of a wire bonder. Thereafter, molding was conducted by the use of a silica-containing epoxy sealant at a temperature of 180° C. at a pressure of 70 kg/cm² to form a resin-made sealing member. Lastly, the external terminals were bent in a desired shape to obtain a product of DRAM.

The DRAM was kept for 200 hours in an atmosphere of 85° C. (temperature) and 85% (relative humidity), then heated at 260° C. for 10 seconds (solder reflowing conditions), and subjected to ultrasonic search to examine the occurrence or nonoccurrence of peeling. There was no peeling between the polyimide film and the sealing resin, and the DRAM was a highly reliable product. In order to examine the heat resistance of polyimide, a polyimide film having a thickness of 10 μm was prepared separately and measured for weight decrease-starting temperature. The polyimide film had a satisfactory weight decrease-starting temperature of 400° C. Incidentally, weight decrease-starting temperature of polyimide film must be at least 380° C. in order for the polyimide film to have sufficient practical applicability.

Japanese Patent Application No. 6-207306 is hereby incorporated in its entirety by reference.

While the present invention has been described in some detail for purposes of clarity and understanding, it will be appreciated by those skilled in the art from a reading of the disclosure that various changes in form and detail can be made without departing from the true scope of the present invention and appended claims.

What is claimed is:

1. A resin-sealed semiconductor device comprising a semiconductor element having a surface-protecting film, external terminals for electrical conduction with outside, and a sealing member comprising a mold resin, in which semiconductor device the surface-protecting film comprises a polyimide obtained by heat-curing of a polyimide precursor composition containing a polyimide precursor having a recurring unit represented by the following general formula (1):

(1)

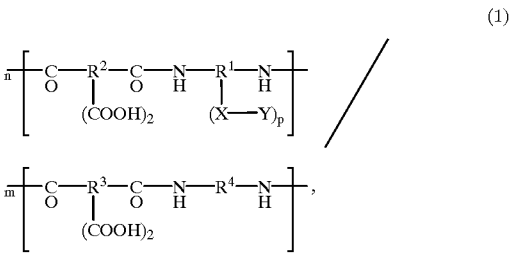

wherein $R^1$ is a trivalent or tetravalent aromatic group; $R^2$ and $R^3$ are each a tetravalent organic group having 4 or more carbon atoms; $R^4$ is a bivalent organic group having 4 or more carbon atoms; X is a bivalent organic group containing at least one member selected from the group consisting of oxygen and nitrogen; Y is a monovalent organic group having 15 or less carbon atoms; n=5–100 and m=0–95 with a proviso that n+m=100; and p is 1 or 2; wherein said polyimide is bonded to said mold resin, and wherein during said heat-curing of the polyimide precursor composition, side chain linkage X-Y of said polyimide precursor undergoes scission and residual groups of said X-Y linkage, after said scission, are bonded to said sealing member through a chemical bond during heat-curing of said sealing member.

2. A resin-sealed semiconductor device according to claim 1, wherein the polyimide precursor composition contains 100 parts by weight of said polyimide precursor, 1–400 parts by weight of an amine compound having a carbon-to-carbon double bond, and 0.1–30 parts by weight of a photosensitizer.

3. A resin-sealed semiconductor device according to claim 1, wherein the polyimide precursor has a recurring unit represented by the following general formula (8):

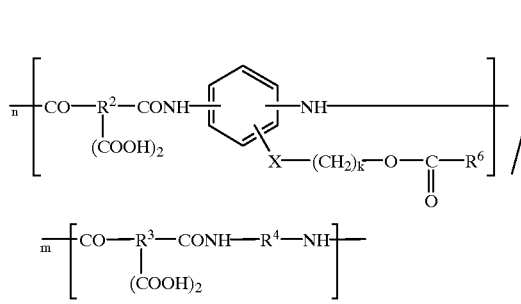
(8)

wherein $R^2$ and $R^3$ are each an tetravalent organic group having 4 or more carbon atoms; $R^4$ is a bivalent organic group having 4 or more carbon atoms; $R^6$ is a phenyl group or an alkyl group having 4 or less carbon atoms; X is a bivalent organic group selected from the group consisting of —COO—, —NHCOO— and —NHCONH—; k is an integer of 2–4; and n=5–100 and m=0–95 with a proviso that n+m=100.

4. A resin-sealed semiconductor device according to claim 1, wherein the semiconductor element is a semiconductor integrated circuit element.

5. A resin-sealed semiconductor device according to claim 1, wherein the semiconductor element is a discrete transistor element.

6. A resin-sealed semiconductor device according to claim 1, wherein the recurring unit represented by the general formula (1) is one selected from the group consisting of:

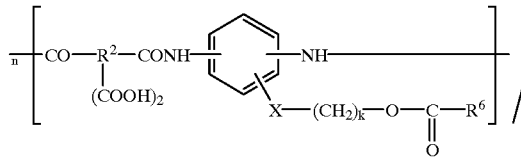

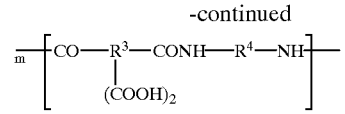
,

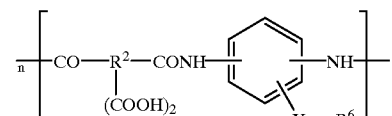
,

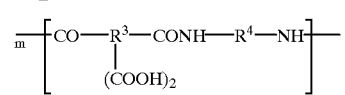
,

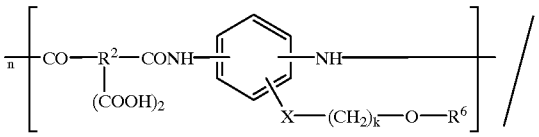
,

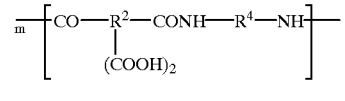
, wherein k is an integer of 2–4, and $R^6$ is a phenyl group or an alkyl group having 4 or less carbon atoms.

7. A resin-sealed semiconductor device according to claim 1, wherein X is selected from the group consisting of —CONH—, —CO—, —NHCOO—, —NHCO—, —NHCONH—, —NH—, —NR⁵, —O— and —CH₂O—, where $R^5$ is an alkyl group of 5 or less carbon atoms.

8. A resin-sealed semiconductor device according to claim 7, wherein Y is selected from the group consisting of —CH₂CH₂OCOCH(CH₃)₂, —CH₂CH₂OCOC(CH₃)₃ and —CH₂CH₂OCOCH₃.

9. A resin-sealed semiconductor device according to claim 3, wherein Y is selected from the group consisting of —CH₂CH₂OCOCH(CH₃)₂, —CH₂CH₂OCOC(CH₃)₃ and —CH₂CH₂OCOCH₃.

10. A resin-sealed semiconductor device according to claim 1, wherein Y is selected from the group consisting of —CH₂CH₂OCOCH(CH₃)₂, —CH₂CH₂OCOC(CH₃)₃ and —CH₂CH₂OCOCH₃.

11. A resin-sealed semiconductor device according to claim 3, wherein X is selected from the group consisting of —NHCOO— and —NHCONH—.

12. A resiri-sealed semiconductor device according to claim 8, wherein Y is selected from the group consisting of —CH₂CH₂OCOCH(CH₃)₂, —CH₂CH₂OCOC(CH₃)₃ and —CH₂CH₂OCOCH₃.

* * * * *